(12) United States Patent
Honda

(10) Patent No.: US 6,750,798 B2
(45) Date of Patent: Jun. 15, 2004

(54) APPARATUS FOR PROCESSING KNOCK SENSOR SIGNAL

(75) Inventor: Takayoshi Honda, Kariya (JP)

(73) Assignee: Denso Corporation, Kariya (JP)

(*) Notice: Subject to any disclaimer, the term of this patent is extended or adjusted under 35 U.S.C. 154(b) by 0 days.

(21) Appl. No.: 10/298,582

(22) Filed: Nov. 19, 2002

(65) Prior Publication Data

US 2003/0209230 A1 Nov. 13, 2003

(30) Foreign Application Priority Data

May 10, 2002 (JP) ........................................ 2002-135728

(51) Int. Cl.$^7$ .............................. F02P 5/00; H03M 1/12; G01L 23/22
(52) U.S. Cl. .................. 341/155; 123/406.34; 701/111; 73/35.03; 708/319
(58) Field of Search ...................... 123/406.34, 406.35, 123/406.36, 406.37, 406.38; 73/35.03, 35.06; 701/111, 115; 341/155

(56) References Cited

FOREIGN PATENT DOCUMENTS

JP          A-5-248937          9/1993

*Primary Examiner*—Howard L. Williams
(74) *Attorney, Agent, or Firm*—Nixon & Vanderhye P.C.

(57) ABSTRACT

A signal-processing apparatus has a digital filter for processing input data from a knock-sensor. The digital filter is designed as an FIR filter characterized by filter coefficients that are equal to values of mince points 0 to 16 obtained based on a reference waveform. The reference waveform is created by concatenating half waves of a first sinusoidal waveform with half waves of a second sinusoidal waveform with peak values equal to half the peak value of the first sinusoidal waveform. The values of mince points 4, 8 and 12 are 0. Each value of mince points 1, 3, 13 and 15 is equal to corresponding value of mince points 5, 7, 9 and 11. The digital filter effectively reduces a filter-processing load.

11 Claims, 24 Drawing Sheets

<14kHz>

<7kHz>

<9.3kHz>

<11.2kHz>

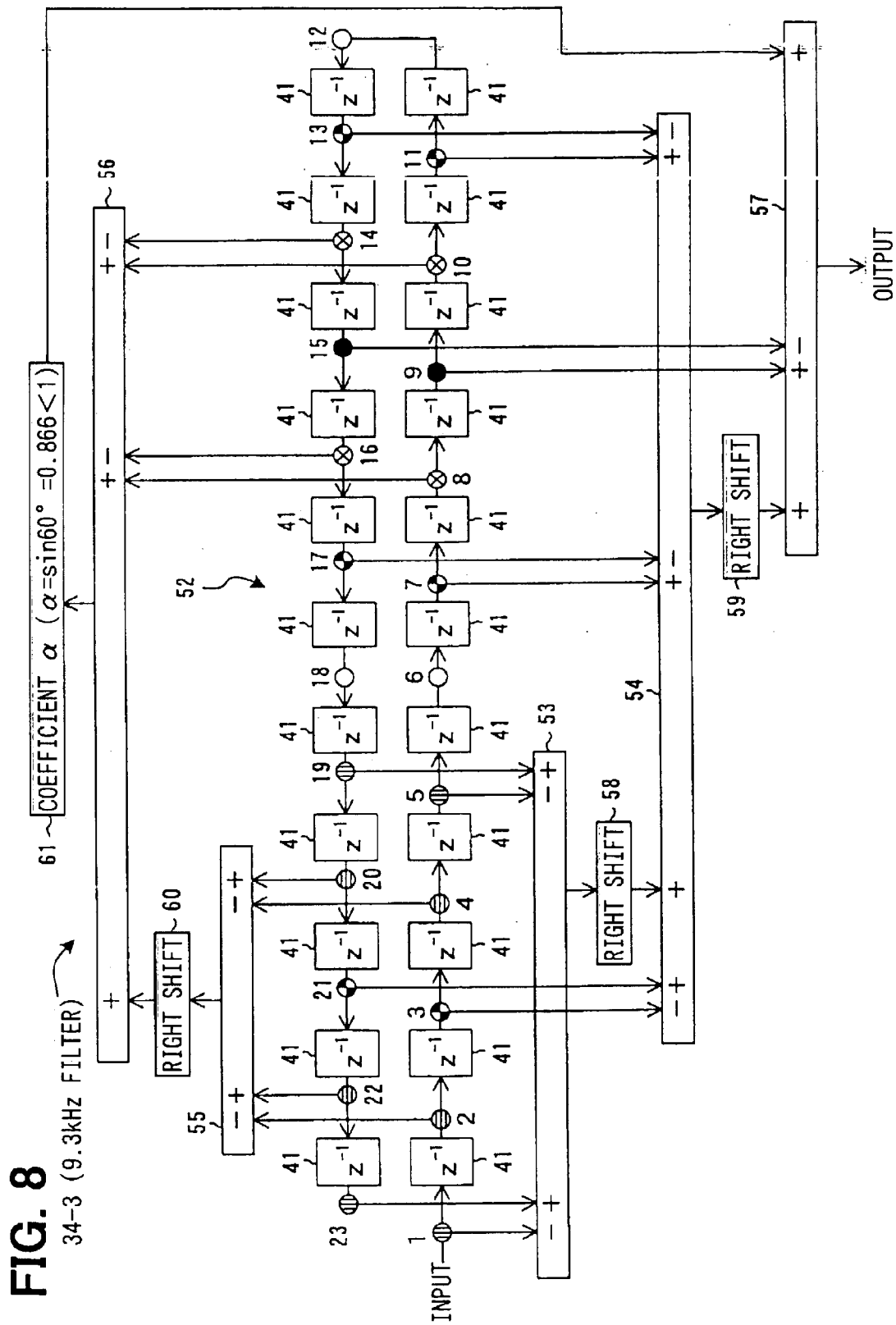
FIG. 8 34-3 (9.3kHz FILTER)

34-4 (11.2kHz FILTER)

<14kHz>

<7kHz>

APPARATUS FOR PROCESSING KNOCK SENSOR SIGNAL

CROSS REFERENCE TO RELATED APPLICATION

This application is based on Japanese Patent Application No. 2002-135728 filed on May 10, 2002 the contents of which are incorporated herein by reference.

BACKGROUND OF THE INVENTION

1. Field of the Invention

The present invention relates to an apparatus for processing a knock sensor signal and a design method of the same. More particularly, the present invention relates to a signal-processing apparatus for digitally processing an analog signal generated by a knock sensor for detecting a knocking.

2. Related Art

A knocking detection apparatus of an internal combustion engine is disclosed in documents such as Japanese Patent No. 2764495 (JP-A No. H5-248937).

In the apparatus disclosed in the document, an analog signal generated by a knock sensor is analyzed by being subjected to a wavelet conversion process in order to detect generation of a knocking. Thus, the analog signal generated by the knock sensor is subjected to an A/D conversion process in an A/D converter at a fixed sampling period, and time-axis data obtained as a result of the A/D conversion process is supplied to a frequency sampling filter to generate a processing result, which is then used as a basis for detecting generation of a knocking. The frequency sampling filter is a digital filter having an impulse response equal to the output of a predetermined basic wavelet function.

That is, in the implementation of a wavelet conversion process, a frequency F to serve as a processing object of a filter for determining whether or not a knocking exists by the wavelet conversion process is determined in advance, and a frequency sampling filter reacting to the frequency F, which is referred to as a filter frequency, is provided. A frequency sampling filter for wavelet conversion is designed so that, in general, the impulse response of the filter has a waveform H with a basic wavelet function's frequency (or the so-called scale) matching the frequency F serving as an object of the filter. (That is, the waveform H is the waveform of a wavelet function having the F frequency). Thus, the output value of a frequency sampling filter designed in this way increases when the frequency of the input waveform Hin, which is the waveform of supplied time-axis data obtained as a result of an A/D conversion process, is equal to the frequency F serving as an processing object of the filter, and the input waveform Hin substantially exceeds the waveform H in the upward and downward directions. The more substantially the input waveform Hin exceeds the waveform H, the more the output value of the frequency sampling filter increases. The output value of the frequency sampling filter having such a characteristic is analyzed to determine whether or not a knocking exists.

By the way, in the apparatus disclosed in the document, the frequency sampling filter is designed to comprise a comb-type filter and a resonator to reduce the number of multiplications in the frequency sampling filter.

However, the document includes a statement saying: "If a wavelet conversion process is carried out using 50 wavelet functions with different scales, the number of multiplications is 750 per sample." Thus, in the sampling frequency filter disclosed in the document, for each sample, 15(=750/50) multiplications are required.

Assume for example that an attempt is made to carry out filter processing (strictly, digital filter processing) up to a maximum frequency of 14 kHz. In this case, it is necessary to set the sampling frequency (that is, the reciprocal of the sampling period) at a value at least equal to 28 kHz in accordance with the sampling theorem. As a matter of fact, it is desirable to set the sampling frequency at about 100 kHz in order to give a high degree of precision with which a knocking is detected. Then, let 3 frequencies including 14 kHz be each a processing object of the filter. In this case, if the frequency sampling filter disclosed in the document is used, for each period of 10 microseconds, which corresponds to a frequency of 100 kHz, 45 (=3×15) multiplications are required so that, the processing load becomes excessively large if an ordinary microcomputer is to be used for carrying out the filtering process, that is, if an ordinary microcomputer is to be used to function as a digital filter. For this reason, a special-purpose microcomputer such as a DSP is required.

SUMMARY OF THE INVENTION

It is thus an object of the present invention addressing the problems to reduce the filter processing load borne by a knock sensor signal processing apparatus used in a knocking detection system for detecting generation of a knocking by analyzing a signal generated by a knock sensor.

In accordance with a first aspect of the present invention, there is provided a knock sensor signal processing apparatus comprising:

an A/D converter for converting a knock-sensor signal generated by a knock sensor provided in an internal combustion engine from an analog signal into a digital signal in an A/D conversion process carried out at a fixed sampling period; and a digital filter for sequentially inputting sampled data obtained as a result of the A/D conversion process carried out by the A/D converter and processing the sampled data.

The digital filter is an FIR (Finite Impulse Response) filter. In addition, filter coefficients h (k) of the digital filter are set in such a way that the filter coefficient h(m)=0 in case the sign of the filter coefficient h(m−1) is different from the filter coefficient h(m+1) where k=0 to n and n is a positive integer.

In accordance with such a knock sensor signal processing apparatus, the filter load to process the knock signal can be reduced effectively.

That is, in general, an FIR filter includes a delay-unit group comprising a plurality of delay units connected to each other in series. The delay unit at the first stage receives pieces of sampled data sequentially with a present input piece of sampled data delayed from the immediately preceding input piece of sampled data by a sampling period. The subsequent delay units following the delay unit at the first stage receive pieces of sampled data from the immediately preceding delay units. The output of each delay unit in this group is multiplied by a coefficient h(k) referred to as a filter coefficient or a filter constant to produce a product. A sum of such products for the delay units, that is, a result of processing to sum up the weighted outputs of the delay units, is the output of the filter.

In an implementation of the knock sensor signal processing apparatus according to the first aspect of the present invention, if the sign of an (m−1)th filter coefficient h(m−1) is different from the sign of an (m+1)th filter coefficient, the mth filter coefficient h(m) between the (m−1)th filter coefficient h(m−1) and the (m+1)th filter coefficient h(m+1) is 0. Thus, the output of a delay unit corresponding to the mth filter coefficient h(m) of 0 does not have to be subjected to filter processing.

In other words, if the sign (or the polarity) of a filter coefficient of a digital filter changes, a zero point is deliberately used in order to reduce a computation load.

Concretely, in designing an FIR filter reacting to a processing-object frequency f of the filter, that is, in designing a FIR filter with a filter frequency f, the filter coefficients h(k) of the FIR filter are set at values equal to values of their respective mince points set on a predetermined reference waveform having a frequency equal to the filter frequency f by mincing the waveform starting from a start of the waveform at intervals each equal to a sampling period to provide a FIR filter having an output value, which increases when the frequency of the waveform representing pieces of time-axis data input sequentially matches the filter frequency f. In this case, zero-cross points of the reference waveform are used as some of the mince points. By doing so, the multiplicand filter coefficients for delay units corresponding to the mince points at the zero-cross points are zero so that, for the outputs of such delay units, no processing is required.

In such an implementation, the filter-processing load can be reduced to an amount that can be carried out by an ordinary microcomputer with ease.

In accordance with a second aspect of the present invention, there is provided a knock sensor signal processing apparatus employing an FIR filter wherein there are at least 4 filter coefficients having the same absolute value.

In such a knock sensor signal processing apparatus, the FIR filter needs to carry out filter processing by performing operations to multiply outputs generated by delay units corresponding to the 4 filter coefficients having the same absolute value by the filter coefficients after addition or subtraction operations of the outputs generated by the delay units.

Thus, the filter-processing load can be reduced effectively. It is to be noted that, in order to provide at least 4 filter coefficients having the same absolute value, it is necessary to create a reference waveform as a waveform having a left-right symmetrical shape, a left-right inverted symmetrical shape or a vertically or horizontally symmetrical shape. A reference waveform having a left-right inverted symmetrical shape is a waveform having at least one right-side period obtained as a result of inversion of a corresponding left-side period.

In accordance with a third aspect of the present invention, there is provided a knock sensor signal processing apparatus employing a digital filter wherein filter processing of outputs generated by delay units is carried out by merely performing shift operations and addition or subtraction operations.

In such a knock sensor signal processing apparatus, the filter processing does not include a multiplication operation imposing a relatively heavy processing load. Thus, the filter-processing load can be reduced to an amount that can be carried out by an ordinary microcomputer with ease.

In accordance with a fourth aspect of the present invention, there is provided a knock sensor signal processing apparatus comprising an A/D converter for carrying out an A/D conversion process on an analog signal generated by a knock sensor at a predetermined sampling period and a digital filter for sequentially inputting pieces of data obtained as a result of the A/D conversion process carried out by the A/D converter as well as processing the data, wherein the filter frequency f of the digital filter is changed when the sampling frequency is changed. It is to be noted that changing the sampling period T is equivalent to changing the sampling frequency (1/T), which is the reciprocal of the sampling period T.

In accordance with the above knock sensor signal processing apparatus, a digital filter designed to reduce a processing load at a filter frequency f1 can be used as it is to reduce a processing load at a filter frequency f2 different from the filter frequency f1. In addition, if the filter frequency is changed, it is necessary to change only the sampling period but not the design of the digital filter.

In accordance with a fifth aspect of the present invention, there is provided a method of designing a knock sensor signal processing apparatus comprising an A/D converter for carrying out an A/D conversion process on an analog signal generated by a knock sensor at a predetermined sampling period and a plurality of digital filters each used for sequentially inputting pieces of data obtained as a result of the A/D conversion process carried out by the A/D converter as well as processing the data and each provided for one of the same plurality of filter frequencies.

As each of the digital filters, a FIR filter is used. In addition, a sampling frequency, which is the reciprocal of the sampling period of the A/D converter, is set at a common multiple of the filter frequencies, or the sampling period is set at a common divisor of periods of time, which are each the reciprocal of one of the filter frequencies.

It is possible to effectively reduce the filter-processing load borne by the knock sensor signal processing apparatus employing the digital filters with filter frequencies different from each other. The filter-processing load is reduced as follows:

(1): First of all, for a specific one of the digital filters, the sampling frequency is set at a multiple of the filter frequency of this specific digital filter. If this specific digital filter is designed as described concretely in the explanation of the first aspect of the present invention, it is easy to produce a plurality of mince points having the same absolute value. As a result, a plurality of filter coefficients having the same absolute value can also be provided with ease as well. Thus, the specific digital filter needs to carry out filter processing by performing an operation to multiply the outputs of the delay units corresponding to the filter coefficients having the same absolute value by the filter coefficients only once after addition or subtraction operations of the outputs generated by the delay units. For this reason, by providing a number of filter coefficients having the same absolute value, the filter-processing load can be reduced.

(2): By setting a sampling frequency, which is the reciprocal of the sampling period, at a common multiple of the filter frequencies, or by setting the sampling period at a common divisor of periods of time, which are each the reciprocal of one of the filter frequencies, the sampling frequency has a value equal to a multiple of the different filter frequencies of all the digital filters. As a result, it is possible to obtain the same effect as that described in section (1).

It is thus possible to effectively reduce the filter-processing load borne by the digital filters having filter frequencies different from each other.

In accordance with a sixth aspect of the present invention, there is provided an implementation of the method of designing a knock sensor signal processing apparatus in accordance with the aforementioned fifth aspect of the present invention, wherein the sampling frequency is set at an even multiple of a least common multiple of the filter frequencies, or the sampling period is set at an even fraction a greatest common measure of periods of time, which are each the reciprocal of one of the filter frequencies.

Thus, the sampling frequency is equal to an even multiple of all the filter frequencies. Accordingly, for all the digital filters, the number of zero-cross points on the reference waveform can be increased. The zero-cross points are each located in every half period within the reference waveform. It is therefore possible to decrease the number of delay units whose outputs are not subjected to processing, that is, the number of delay units whose outputs are not used. As a result, the filter-processing load can be further reduced.

If a specific one fb of the filter frequencies is equal to 1/n of a particular one fa of the filter frequencies where n is a positive integer, it is desirable to design one of the digital filters that has a filter frequency equal to the specific filter frequency fb, which is equal to 1/n of the particular filter frequency fa, as an FIR filter by replacing each delay unit employed in one of the digital filters that has a filter frequency equal to the particular filter frequency fa with n delay units connected to each other in series. Thus, the number of delay units employed in the digital filter having a filter frequency equal to the specific filter frequency fb is n times the number of delay units employed in the digital filter having a filter frequency equal to the particular filter frequency fa. However, the outputs of the delay units employed in the digital filter having a filter frequency equal to the specific filter frequency fb are thinned, that is, only 1 of every n outputs is subjected to filter processing.

By providing such a configuration, the work to design a plurality of digital filters can be carried out with ease. In addition, it is possible to reduce the number of times the computation is carried out in the digital filter having a filter frequency equal to the specific filter frequency fb.

BRIEF DESCRIPTION OF THE DRAWINGS

Features and advantages of embodiments will be appreciated, as well as methods of operation and the function of the related parts, from a study of the following detailed description, the appended claims, and the drawings, all of which form a part of this application. In the drawings:

FIG. 8 is a block diagram showing the configuration of the 9.3 kHz filter provided by the first embodiment;

DETAILED DESCRIPTION OF THE PREFERRED EMBODIMENT

The following description explains a knock sensor signal processing apparatus implemented by embodiments of the present invention. First of all, what is common to the embodiments is described.

Figure 1:
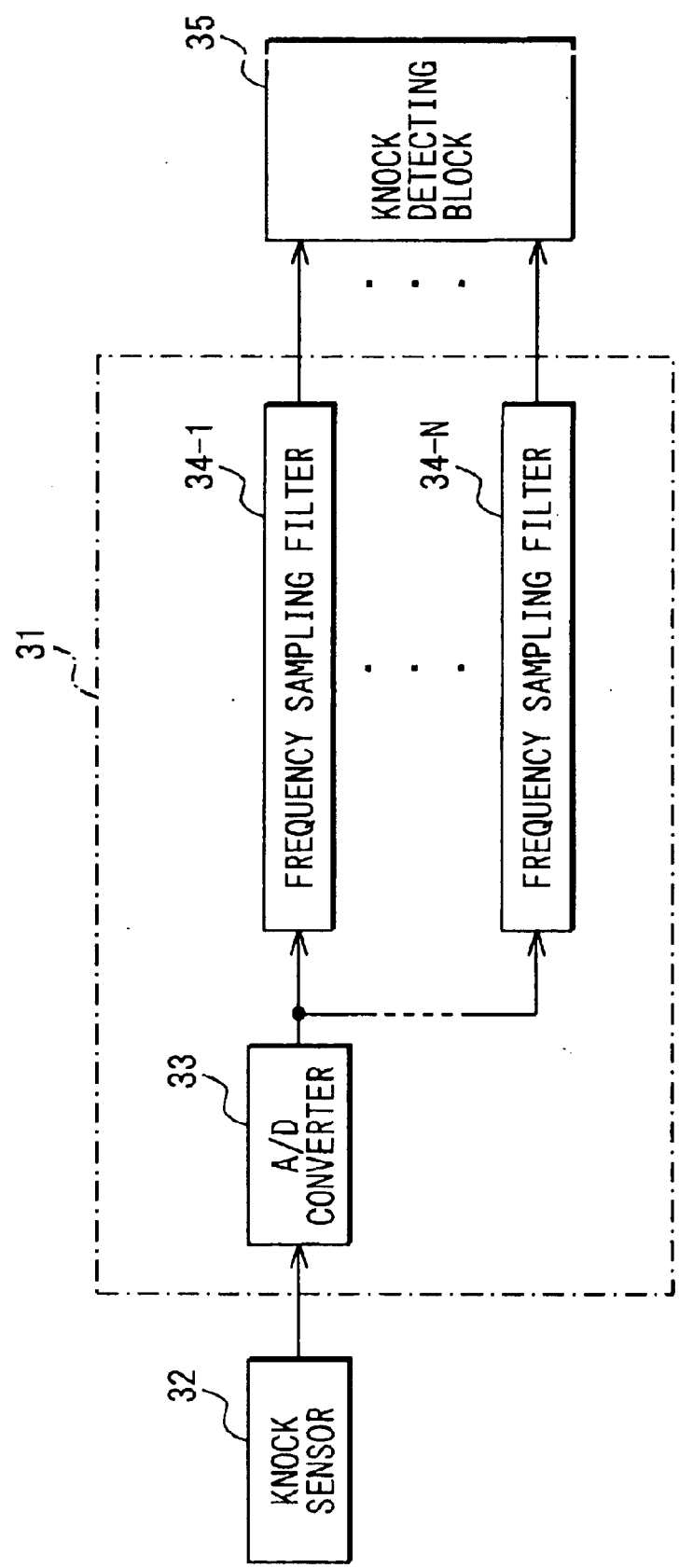
FIG. 1 is a block diagram showing the configuration of a knock sensor signal processing apparatus implemented by an embodiment.

A knock sensor signal processing apparatus 31 shown in FIG. 1 is implemented by an embodiment as a part of a knock detection system for detecting generation of a knock by analyzing an analog signal generated by a knock sensor 32 provided on an internal combustion engine. The knock detection system implemented in an engine control unit for controlling the internal combustion engine analyzes the analog signal, which is also referred to hereafter as a knock-sensor signal, by carrying out a wavelet conversion process. As shown in the figure, the knock sensor signal processing apparatus 31 comprises an A/D converter 33 and N frequency sampling filters 34 (34-1 to 34-N). The A/D converter 33 carries out an A/D conversion process on a knock-sensor signal at a fixed sampling period T. The frequency-sampling filters 34 (34-1 to 34-N) each sequentially input pieces of data obtained as a result of the A/D conversion process.

The knock detection system comprises the knock sensor signal processing apparatus 31 and a knock detection unit 35. Signals output by the frequency-sampling filters 34 (34-1 to 34-N) are supplied to the knock detection unit 35 for determining whether or not a knock exists on the basis of values of the signals output by the frequency-sampling filters 34.

It is to be noted that the frequency-sampling filters 34 and the knock detection unit 35 are not hardware. Instead, they are implemented by a microcomputer included in the engine control unit and software to be executed by the microcomputer for carrying out processing. In this embodiment, the frequency-sampling filters 34 are each a digital filter for carrying out a wavelet conversion process. The frequency-sampling filters 34 have filter frequencies different from each other. Each of the frequency-sampling filters 34 is designed so that the output value of the frequency sampling filter 34 increases when the frequency of the input waveform, which is the waveform of time-axis data supplied by the A/D converter 33, is equal to its own filter frequency, and the input waveform substantially exceeds a predetermined reference waveform H having a frequency equal to the filter frequency in the upward and downward directions. The more substantially the input waveform exceeds the predetermined reference waveform H, the more the output value of the frequency sampling filter 34 increases. The reference waveform H is the waveform of a wavelet function with the scale thereof matching the filter frequency.

First Embodiment

In the knock sensor signal processing apparatus 31 implemented by a first embodiment, considering a knock-sensor signal's characteristic delayed in the event of a knocking, the frequency-sampling filters 34 referred to hereafter simply as filters 34 are designed to comprise a 7 kHz filter 34-1, a 14 kHz filter 34-2, a 9.3 kHz filter 34-3 and a 11.2 kHz filter 34-4. The 7 kHz filter 34-1 is a filter having its filter frequency equal to a knock fundamental wave's frequency of 7 kHz. The knock fundamental wave is the fundamental wave of a knock sensor generated in the event of a knocking. The 14 kHz filter 34-2 is a filter having its filter frequency equal to the frequency of the second-order harmonic wave of the knock fundamental wave. The frequency of the second-order harmonic wave is 14 kHz. The 9.3 kHz filter 34-3 is a filter having its filter frequency equal to the frequency of a 1.5th-order harmonic wave of the knock fundamental wave. The frequency of the 1.5th-order harmonic wave is 9.3 kHz. The 11.2 kHz filter 34-4 is a filter having its filter frequency equal to the frequency of another $1.5^{th}$-order harmonic wave of the knock fundamental wave. The frequency of the other $1.5^{th}$-order harmonic wave is 11.2 kHz. It is to be noted that, strictly, the frequency value of 9.3 kHz is equal to 14 kHz/1.5 while the frequency value of 11.2 kHz is equal to 14 kHz/1.25.

The filters 34-1 to 34-4 are designed as follows.

Figure 2:
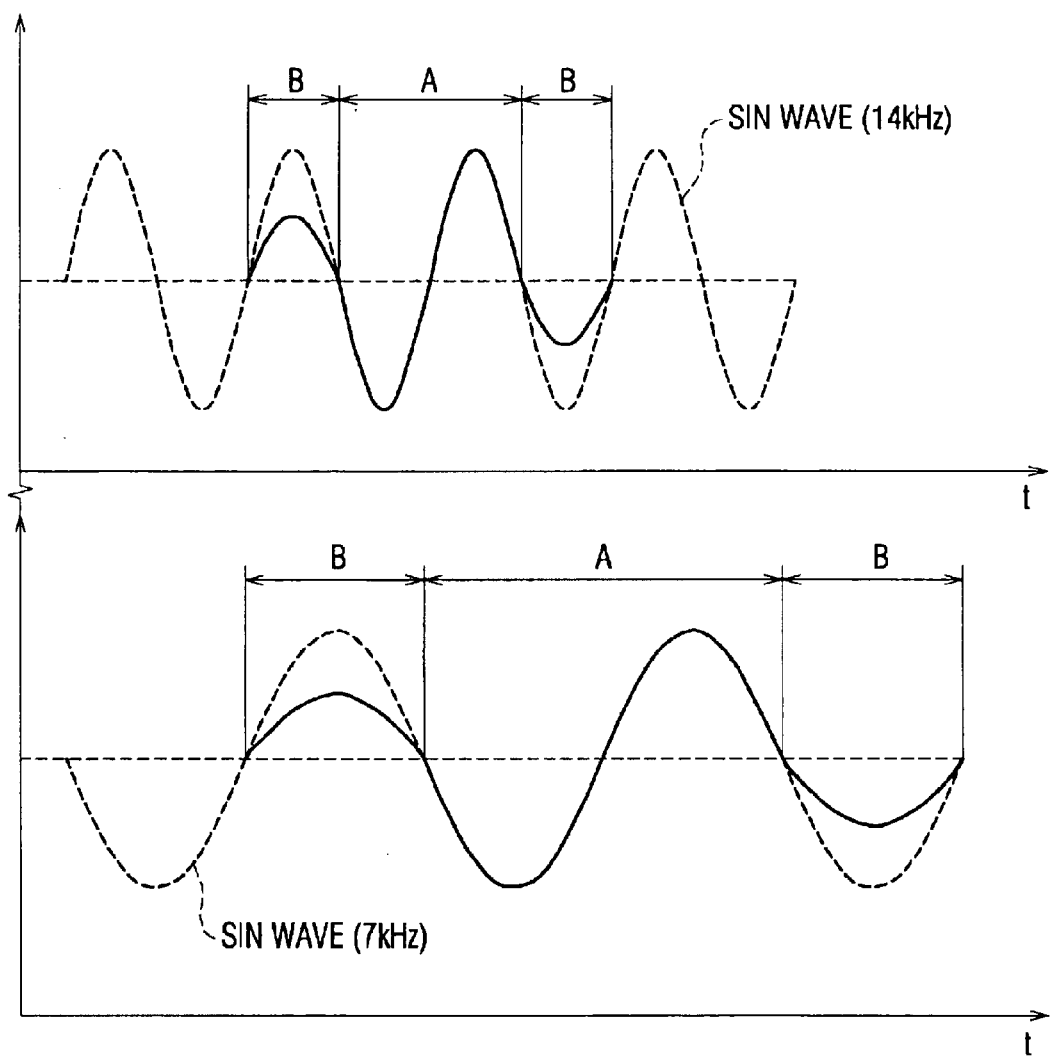
FIG. 2 is an explanatory diagram used for describing a method provided by a first embodiment to create a reference waveform corresponding to the waveform of a wavelet function of a frequency filter.

(1-1): First of all, the reference waveform corresponding to the waveform of the wavelet function of each of the filters 34-1 to 34-4 is created by combining half waves of a sinusoidal waveform having a frequency equal to the filter frequency as shown in FIG. 2.

Let wave A denote a negative half wave of a sinusoidal waveform with a frequency of 14 kHz and a peak value of 1 while wave B denote a negative half wave of a sinusoidal waveform with a frequency of 14 kHz and a peak value of ½. In the case of the 14 kHz filter 34-2, the reference waveform is created by concatenating waves A and B in the following order: inverted wave B followed by wave A followed by inverted wave A followed by wave B as shown in the upper diagram of FIG. 2. The resulting reference waveform is a left-right inverted symmetrical waveform including 2 waves A and 2 waves B. A left-right inverted symmetrical waveform is a horizontal point symmetrical waveform symmetrical with respect to the vertical center line of the waveform except that the shape of the waveform's portion on the right side of the vertical center line is obtained by inverting the shape of the waveform's portion on the left side of the vertical center line.

The reference waveform of the 7 kHz filter 34-1 is created in the same way as the 14 kHz filter 34-2. In detail, again, let wave A denote a negative half wave of a sinusoidal waveform with a frequency of 7 kHz and a peak value of 1 while wave B denote a negative half wave of a sinusoidal waveform with a frequency of 7 kHz and a peak value of ½. The reference waveform is created by concatenating waves A and B in the following order: inverted wave B followed by wave A followed by inverted wave A followed by wave B as shown in the lower diagram of FIG. 2. The resulting reference waveform is a left-right inverted symmetrical waveform including 2 waves A and 2 waves B. The left-right inverted symmetrical waveform has been described above. It is to be noted that the waveform shown in the lower diagram of FIG. 2 is obtained by magnifying the waveform shown in the upper diagram of FIG. 2 at a scaling factor of 2 in the horizontal direction.

By the same token, the reference waveform of the 9.3 kHz filter 34-3 is created in the same way as the 14 kHz filter 34-2 except that waves A and B are each a negative half wave of a sinusoidal waveform with a frequency of 9.3 kHz. Likewise, the reference waveform of the 11.2 kHz filter 34-4 is created in the same way as the 14 kHz filter 34-2 except that waves A and B are each a negative half wave of a sinusoidal waveform with a frequency of 14 kHz. Thus, the resulting reference waveform of the 9.3 kHz filter 34-3 is a waveform obtained by magnifying the reference waveform of the 14 kHz filter 34-2 at a scaling factor of 1.5 (=14/9.3) in the horizontal direction. As described above, the reference waveform of the 14 kHz filter 34-2 is shown in the upper diagram of FIG. 2. On the other hand, the resulting reference waveform of the 11.2 kHz filter 34-4 is a waveform obtained by magnifying the reference waveform of the 14 kHz filter 34-2 at a scaling factor of 1.25 (=14/11.2) in the horizontal direction.

That is, in the first embodiment, a left-right inverted symmetrical waveform is used as the waveform of the basic wavelet function (the mother wavelet function). As described above, the left-right inverted symmetrical waveform is created by concatenating waves A and B in the following order: inverted wave B followed by wave A followed by inverted wave A followed by wave B where wave A is a negative half wave of a sinusoidal waveform with a peak value of 1 while wave B is a negative half wave of a sinusoidal waveform with a peak value of ½.

(1-2): As described above, the A/D converter 33 carries out an A/D conversion process on the knock-sensor signal at a sampling frequency, which is defined as the reciprocal of the sampling period T. The sampling frequency is a common multiple of the filter frequencies of 7 kHz, 9.3 kHz, 11.2 kHz and 14 kHz. Concretely, the sampling frequency is set at an even multiple of the least common multiple (=56 kHz) of the filter frequencies. Since the filter frequencies are 7 kHz, 9.3 kHz, 11.2 kHz and 14 kHz, their least common multiple is 52 kHz. In the case of the first embodiment, the sampling frequency is set at 112 kHz (=2×56 kHz=8×14 kHz). In other words, the sampling period (sampling interval) T is also a common divisor of the filter periods, which are the reciprocals of their respective filter frequencies. Concretely, the sampling period is set at an even fraction of the greatest common measure.

(1-3): The frequency-sampling filters 34-1 to 34-4 are each a FIR filter having an impulse response with a finite length. Each of the frequency-sampling filters 34-1 to 34-4 is designed so that values of mince points are equal to coefficients of the filter. Specifically, the value of a mince point is the height of the mince point. A mince point is a point on the left-right inverted symmetrical reference waveform created in paragraph (1-1) described above. A mince point is obtained as a result of mincing the left-right inverted symmetrical reference waveform at sampling intervals T, starting from an end of the waveform. The concrete configurations of the frequency-sampling filters 34-1 to 34-4 are explained as follows.

Figure 3:
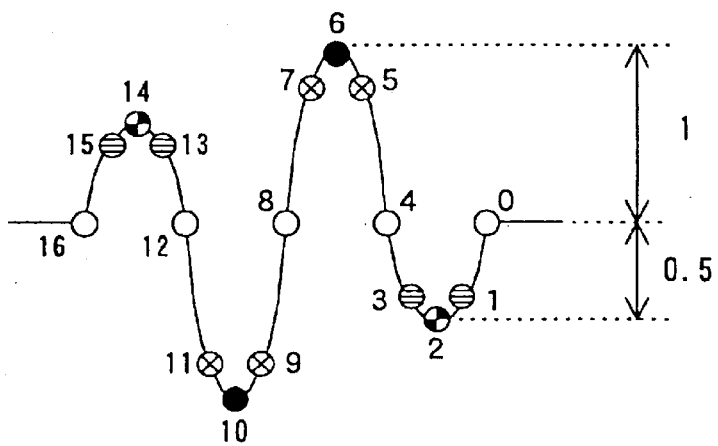
FIG. 3 is a diagram showing mince points on a reference waveform for a 14 kHz filter provided by the first embodiment.

(1-3-1): First of all, in the case of the 14 kHz filter 34-2, mince points on the reference waveform are numbered 0 to 16 as shown in FIG. 3. The mince points are obtained by mincing the reference waveform, starting from its end at phase intervals of 45 degrees to divide the reference waveform into 16 segments. The 14 kHz filter 34-2 is then designed into a configuration shown in FIG. 4 wherein the coefficients of the 14 kHz filter 34-2 are equal to the values of the mince points shown in FIG. 3.

Figure 4:
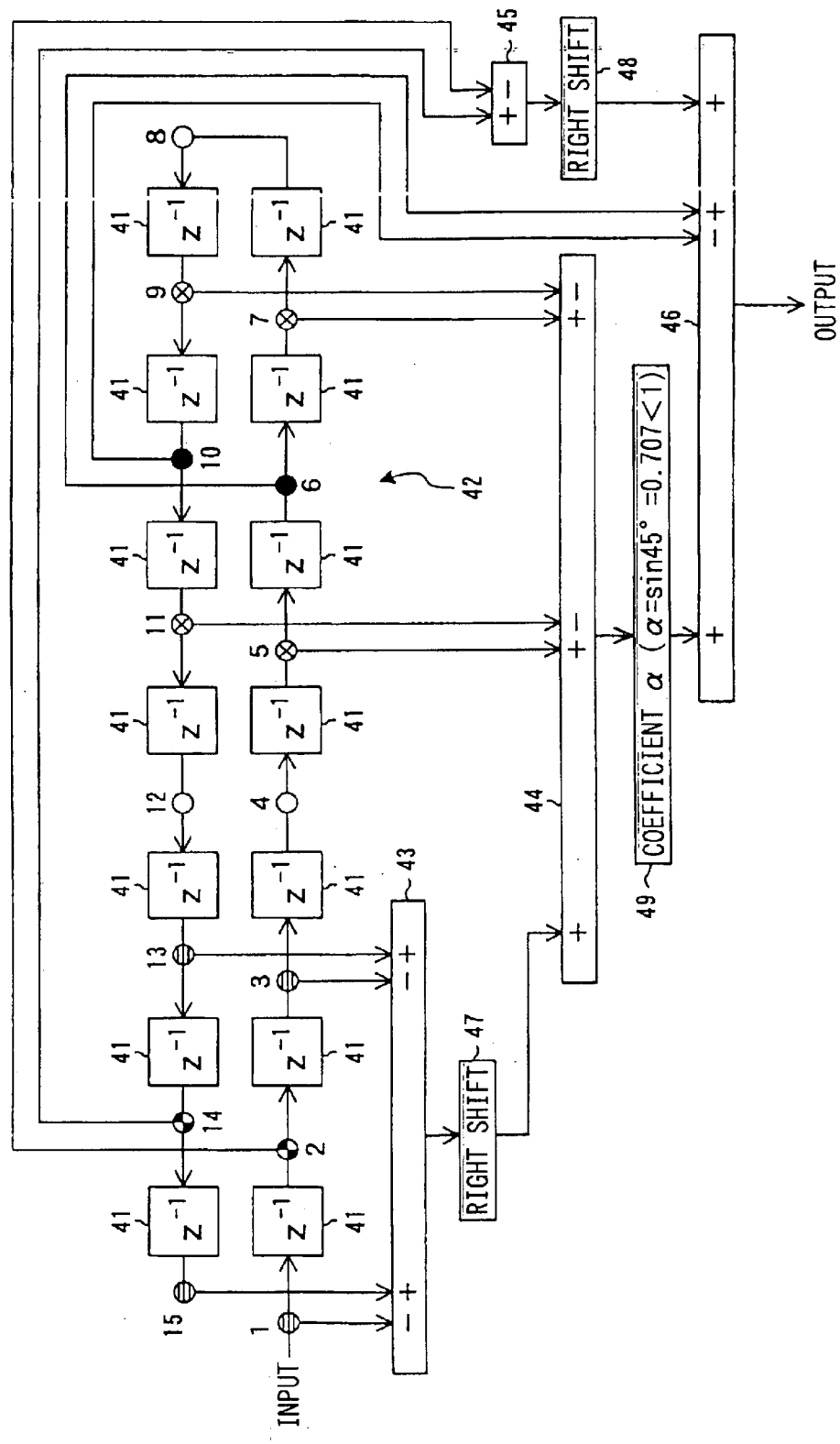
FIG. 4 is a block diagram showing the configuration of the 14 kHz filter provided by the first embodiment.

As shown in FIG. 4, the 14 kHz filter 34-2 comprises a delay-unit group 42, addition & subtraction units 43, 44, 45 and 46, 2 right-shift units 47 and 48 as well as a multiplication unit 49. The delay-unit group 42 comprises 14 delay units 41 connected to each other in series so that each of the delay units 41 outputs its output lagging behind its input by the sampling period T. The delay unit 41 at the first stage receives pieces of sampled data sequentially from the A/D converter 33. Each of the right-shift units 47 and 48 shifts an input to the right by 1 bit and outputs the shifted input. The multiplication unit 49 multiplies its input by a coefficient α of 0.707, which is the value of sin 45 degrees.

Let data 1 be the input to the delay unit 41 at the first stage and data 2 be the output from the delay unit 41 at the second stage whereas data 3, data 4, . . . and data 15 be outputs of respectively the delay units 41 subsequently following the delay unit 41 at the second stage in the delay-unit group 42. In the 14 kHz filter 34-2, the addition & subtraction unit 43 carries out addition and subtraction operations of 'data 13+data 15−data 1−data 3.' The output of the addition & subtraction unit 43 is shifted to the right by 1 bit by the right-shift unit 47 to produce ½ the value of the output.

Then, the addition & subtraction unit 44 carries out addition and subtraction operations of 'the output of the right-shift unit 47+data 5+data 7−data 9−data 11.' The multiplication unit 49 multiplies the output of the addition & subtraction unit 44 by the value (=0.707) of sin 45 degrees.

In addition, the addition & subtraction unit 45 carries out a subtraction operation of 'data 14−data 2.' The output of the addition & subtraction unit 45 is shifted to the right by 1 bit by the right-shift unit 48 to produce ½ the value of the output. Furthermore, the addition & subtraction unit 46 carries out addition and subtraction operations of 'the output of the multiplication unit 49+data 6−data 10+the output of the right-shift unit 48.' The output of the addition & subtraction unit 46 is the output of the 14 kHz filter 34-2.

Let mince points numbered 0 to 16 as shown in FIG. 3 be called mince point 0, mince point 1, mince point 2, . . . mince point 15 and mince point 16 respectively. In this case, in the 14 kHz filter 34-2, the filter coefficients are equal to the values of the mince points shown in FIG. 3. Specifically, the filter coefficient for data 1 is the value (=−sin 45 degrees/2) of mince point 1, the filter coefficient for data 2 is the value (=−0.5) of mince point 2, the filter coefficient for data 3 is the value (=−sin 45 degrees/2) of mince point 3, the filter coefficient for data 4 is the value (=0) of mince point 4, the filter coefficient for data 5 is the value (=sin 45 degrees/2) of mince point 5, the filter coefficient for data 6 is the value (=1) of mince point 6 . . . and the filter coefficient for data 15 is the value (=sin 45 degrees/2) of mince point 15.

It is to be noted that 5 mince points 0, 4, 8, 12 and 16, which are each marked by a white circle symbol ○ shown in FIG. 3, are each a zero-cross point of the reference waveform. Thus, no delay units are provided for mince points 0 and 16. In addition, outputs of the third, seventh and eleventh delay units 41 corresponding to mince points 4, 8 and 12 respectively are each associated with a multiplicand coefficient of 0 in order to exclude them from processing.

Figure 5:
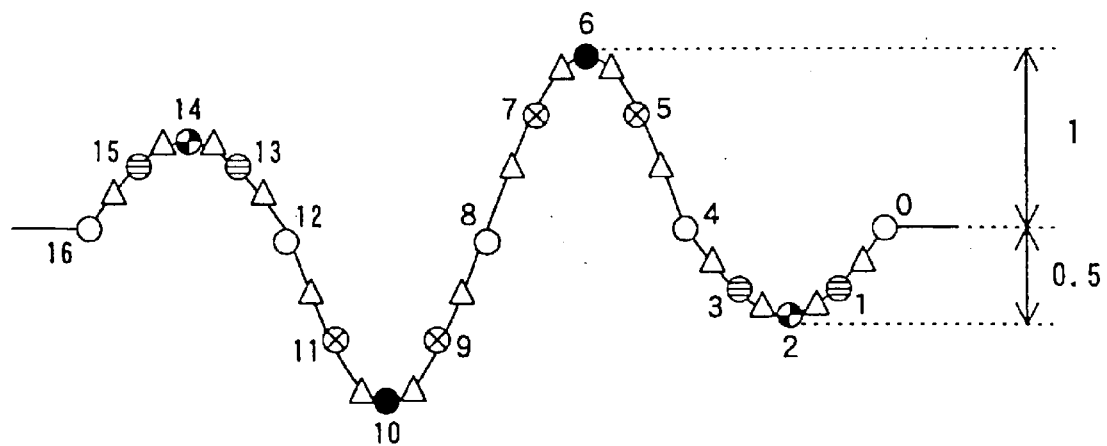
FIG. 5 is a diagram showing mince points on a reference waveform for a 7 kHz filter provided by the first embodiment.

(1-3-2): Next, in the case of the 7 kHz filter 34-1, mince points on the reference waveform are points numbered 0 to 16 and points each marked with a triangle symbol Δ as shown in FIG. 5. Mince points 0 to 16 are obtained by mincing the reference waveform, starting from its end at phase intervals of 45 degrees to divide the reference waveform into 16 segments. On the other hand, the points each marked with a triangle symbol Δ are each a point with an intermediate phase between 2 adjacent numbered mince points. The 7 kHz filter 34-1 is then designed into a configuration shown in FIG. 6 wherein the coefficients of the 7 kHz filter 34-1 are equal to the values of some selected specific ones of the mince points shown in FIG. 5. If the mince points each marked with a triangle symbol Δ are excluded from the selection of the specific mince points, the specific mince points are points at every other numbered mince point. If the mince points each marked with a triangle symbol Δ are included in the selection of the specific mince points, on the other hand, the specific mince points are points at every third mince point.

That is, the 7 kHz filter 34-1 is designed by replacing each delay unit 41 of the delay-unit group employed in the 14 kHz filter 34-2 with a pair of delay units 41a and 41b connected to each other in series. The rest is the same as the configuration of the 14 kHz filter 34-2. In other words, the number of delay units employed in the 7 kHz filter 34-1 is twice the number of delay units employed in the 14 kHz filter 34-2. In addition, in the case of the 7 kHz filter 34-1, outputs of the delay units are thinned by selecting only an output for every other delay unit 41. That is, only outputs of every other delay unit 41 are used in the filter processing.

Let mince points numbered 0 to 16 shown in FIG. 5 be called mince point 0, mince point 1, mince point 2, . . . mince point 15 and mince point 16 respectively. In this case, in the 7 kHz filter 34-1, the values of mince points 1 to 15 are equal to filter coefficients for which each pair of delay units 41a and 41b is used as a delay unit introducing a delay time of 2 sampling periods (=2×T).

It is to be noted that the mince points each marked with a triangle symbol Δ in FIG. 5 are excluded from the filter processing by the process to thin the outputs of the delay units 41 as described above. Thus, the outputs of the delay units each corresponding to one of the mince points each marked with a triangle symbol Δ are excluded from the filter processing in the 7 kHz filter 34-1 shown in FIG. 6. The delay units each corresponding to one of the mince points marked with triangle symbols Δ are delay units 41b added to the 14 kHz filter 34-2 shown in FIG. 4.

Figure 7:
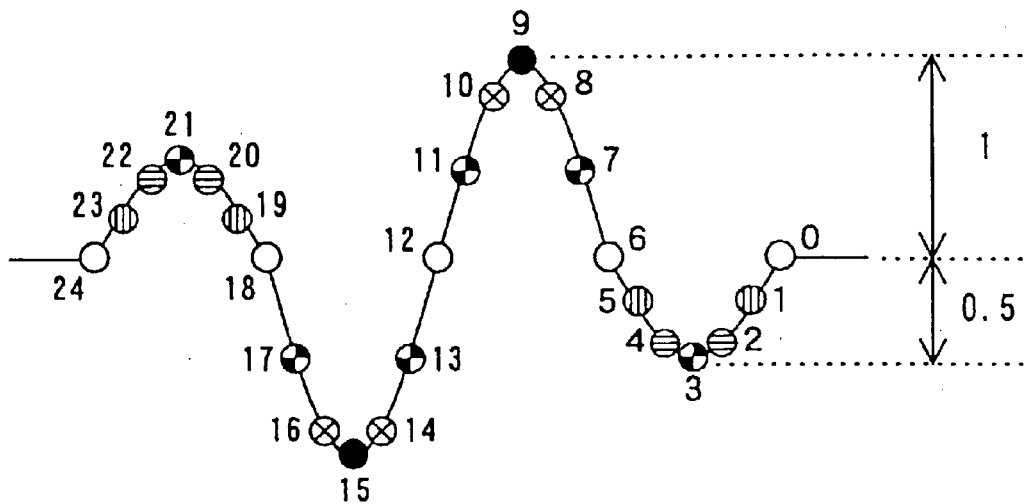
FIG. 7 is a diagram showing mince points on a reference waveform for a 9.3 kHz filter provided by the first embodiment.

(1-3-3): Next, in the case of the 9.3 kHz filter 34-3, mince points on the reference waveform are numbered 0 to 24 as shown in FIG. 7. The mince points are obtained by mincing the reference waveform, starting from its end at phase intervals of 30 degrees to divide the reference waveform into 24 segments. The 9.3 kHz filter 34-3 is then designed into a configuration shown in FIG. 8 wherein the coefficients of the 9.3 kHz filter 34-3 are equal to the values of the mince points shown in FIG. 7.

As shown FIG. 8, the 9.3 kHz filter 34-3 comprises a delay-unit group 52, addition & subtraction units 53, 54, 55, 56 and 57, 3 right-shift units 58, 59 and 40 as well as a multiplication unit 61. The delay-unit group 52 comprises 22 delay units 41 connected to each other in series so that each of the delay units 41 outputs its output lagging behind its input by the sampling period T. The delay unit 41 at the first stage receives pieces of sampled data sequentially from the A/D converter 33. Each of the right-shift units 58 to 60 shifts an input to the right by 1 bit and outputs the shifted input. The multiplication unit 61 multiplies its input by a coefficient α of 0.866, which is the value of sin 60 degrees.

Let data 1 be the input to the delay unit 41 at the first stage and data 2 be the output from the delay unit 41 at the second stage at the first stage whereas data 3, data 4, . . . and data 23 be outputs of respectively the delay units 41 subsequently following the delay unit 41 at the second stage in the delay-unit group 52. In the 9.3 kHz filter 34-3, the addition & subtraction unit 53 carries out addition and subtraction operations of 'data 19+data 23−data 1−data 5.' The output of the addition & subtraction unit 53 is shifted to the right by 1 bit by the right-shift unit 58 to produce ½ the value of the output.

Then, the addition & subtraction unit 54 carries out addition and subtraction operations of 'the output of the right-shift unit 58−data 3+data 7+data 11−data 13−data 17+data 21.' The right-shift unit 59 shifts the output of the addition & subtraction unit 54 to the right by 1 bit to produce ½ the value of the output.

In addition, the addition & subtraction unit 55 carries out addition and subtraction operations of 'data 20+data 22−data 2−data 4.' The output of the addition & subtraction unit 55 is shifted to the right by 1 bit by the right-shift unit 60 to produce ½ the value of the output. Furthermore, the addition & subtraction unit 56 carries out addition and subtraction operations of 'the output of the right-shift unit 60+data 8+data 10−data 14−data 16.' The multiplication unit 61 multiplies the output of the addition & subtraction unit 56 by the value (=0.866) of sin 60 degrees.

In addition, the addition & subtraction unit 57 carries out addition and subtraction operations of 'the output of the multiplication unit 61+the output of the right-shift unit 59+data 9−data 15.' The output of the addition & subtraction unit 53 is the output of the 9.3 kHz filter 34-3.

Let mince points numbered 0 to 24 as shown in FIG. 7 be called mince point 0, mince point 1, mince point 2, . . . mince point 23 and mince point 24 respectively. In this case, in the 9.3 kHz filter 34-3, the filter coefficients are equal to the values of the mince points shown in FIG. 7. Specifically, the filter coefficient for data 1 is the value (=−0.25) of mince point 1, the filter coefficient for data 2 is the value (=−sin 60 degrees/2) of mince point 2, the filter coefficient for data 3 is the value (=−0.5) of mince point 3, . . . and the filter coefficient for data 23 is the value (=0.25) of mince point 23.

It is to be noted that 5 mince points 0, 6, 12, 18 and 24, which are each marked by a white circle symbol ○ in FIG. 7, are each a zero-cross point of the reference waveform. Thus, no delay units are provided for mince points 0 and 24. In addition, outputs of the fifth, eleventh and seventeenth delay units 41 corresponding to mince points 6, 12 and 18 respectively are each associated with a multiplicand coefficient of 0 in order to exclude them from processing. On the other hand, the right-shift unit 59 shown in FIG. 8 plays the role of multiplying data 1, data 5, data 7, data 11, data 13, data 17, data 19 and data 23 by sin 30 degrees as well as plays the role of multiplying data 3 and data 21 by ½.

Figure 9:
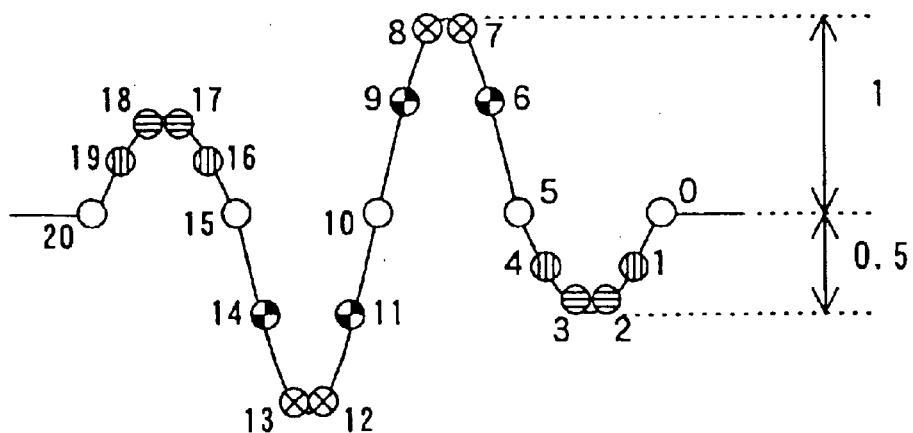
FIG. 9 is a diagram showing mince points on a reference waveform for a 11.2 kHz filter provided by the first embodiment.

(1-3-4): Next, in the case of the 11.2 kHz filter 34-4, mince points on the reference waveform are numbered 0 to 20 as shown in FIG. 9. The mince points are obtained by mincing the reference waveform, starting from its end at phase intervals of 36 degrees to divide the reference waveform into 20 segments. The 9.3 kHz filter 34-3 is then designed into a configuration shown in FIG. 10 wherein the coefficients of the 11.2 kHz filter 34-4 are equal to the values of the mince points shown in FIG. 9.

Figure 10:
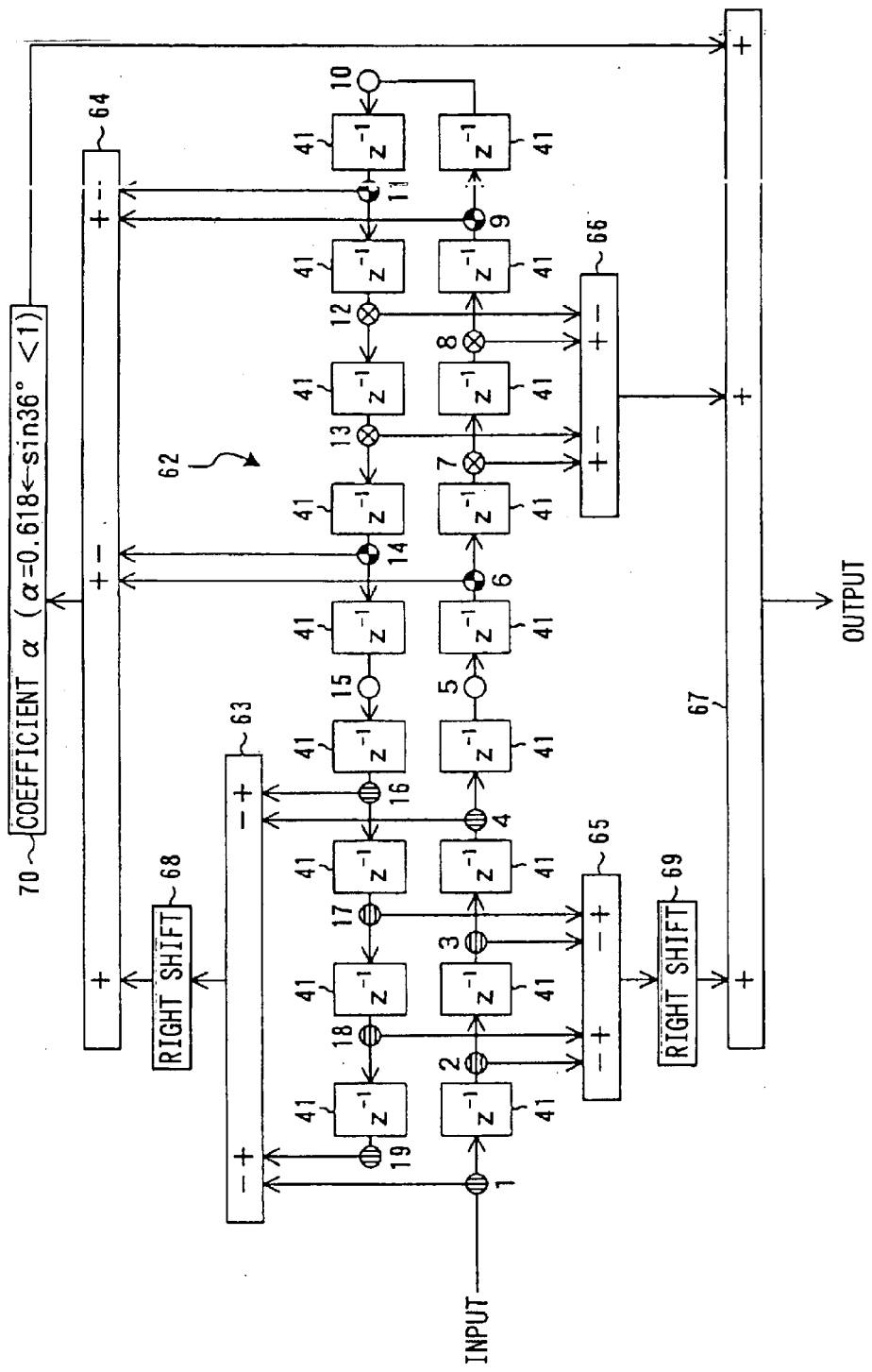
FIG. 10 is a block diagram showing the configuration of the 11.2 kHz filter provided by the first embodiment.

As shown FIG. 10, the 11.2 kHz filter 34-4 comprises a delay-unit group 62, addition & subtraction units 63, 64, 65, 66 and 67, 2 right-shift units 68 and 69 as well as a multiplication unit 70. The delay-unit group 62 comprises 18 delay units 41 connected to each other in series so that each of the delay units 41 outputs its output lagging behind its input by the sampling period T. The delay unit 41 at the first stage receives pieces of sampled data sequentially from the A/D converter 33. Each of the right-shift units 68 and 69 shifts an input to the right by 1 bit and outputs the shifted input. The multiplication unit 70 multiplies its input by a coefficient α of 0.618, which is a value corresponding to sin 36 degrees. The coefficient α of 0.618 is used in place of sin 36 degrees (=0.588) because the 11.2 kHz filter 34-4 treats the value of sin 72 degrees (=0.951) as 1, which is a product of 0.951 and a multiplying factor of 1.051 (=1/0.951). The coefficient α (=0.618) is a product of sin 36 degrees (=0.588) and the multiplying factor of 1/0.951.

Let data 1 be the input to the delay unit 41 at the first stage and data 2 be the output from the delay unit 41 at the second stage at the first stage whereas data 3, data 4, . . . and data 19 be outputs of respectively the delay units 41 subsequently following the delay unit 41 at the second stage in the delay-unit group 62. In the 11.2 kHz filter 34-4, the addition & subtraction unit 63 carries out addition and subtraction operations of 'data 16+data 19−data 1−data 4.' The output of the addition & subtraction unit 63 is shifted to the right by 1 bit by the right-shift unit 68 to produce ½ the value of the output.

Then, the addition & subtraction unit 64 carries out addition and subtraction operations of 'the output of the right-shift unit 68+data 6+data 9−data 11−data 14.' The multiplication unit 70 multiplies the output of the addition & subtraction unit 64 by a coefficient a of 0.618. On the other hands, the addition & subtraction unit 65 carries out addition and subtraction operations of 'data 17+data 18−data 2−data 3.' The right-shift unit 69 shifts the output of the addition & subtraction unit 65 to the right by 1 bit to produce ½ the value of the output.

In addition, the addition & subtraction unit 66 carries out addition and subtraction operations of 'data 7+data 8−data 12–data 13.' Furthermore, the addition & subtraction unit 67 carries out addition and subtraction operations of 'the output of the multiplication unit 70+the output of the right-shift unit 69+the output of the addition & subtraction unit 66.' The output of the addition & subtraction unit 67 is the output of the 11.2 kHz filter 34-4.

Let mince points numbered 0 to 20 as shown in FIG. 9 be called mince point 0, mince point 1, mince point 2, . . . mince point 19 and mince point 20 respectively. In this case, in the 11.2 kHz filter 34-4, the filter coefficients are equal to 1.051 times the values of the mince points 1 to 19 shown in FIG. 9. Specifically, the filter coefficient (=−0.618/2) for data 1 is 1.051 times the value of mince point 1, the filter coefficient (=−0.5) for data 2 is 1.051 times the value of mince point 2, the filter coefficient (=−0.618) for data 3 is 1.051 times the value of mince point 3, . . . the filter coefficient (=0.618/2) for data 6 is 1.051 times the value of mince point 6, the filter coefficient (=1) for data 7 is 1.051 times the value of mince point 7 . . . and the filter coefficient (=0.618/2) for data 19 is 1.051 times the value of mince point 19. This is because, since the value of sin 72 degrees is normalized to 1 and 0.618 is regarded as the value of sin 36 degrees, the filter coefficients are set at values equal to 1.051 times the values of their respective mince points shown in FIG. 9 as described above.

It is to be noted that, in the case of the 11.2 kHz filter 34-4, 5 mince points 0, 5, 10, 15 and 20, which are each marked by a white circle symbol ○ shown in FIG. 9, are each a zero-cross point of the reference waveform. Thus, no delay units are provided for mince points 0 and 20. In addition, outputs of the fourth, ninth and fourteenth delay units 41 corresponding to mince points 5, 10 and 15 respectively are each associated with a multiplicand coefficient of 0 in order to exclude them from processing.

Figure 11:
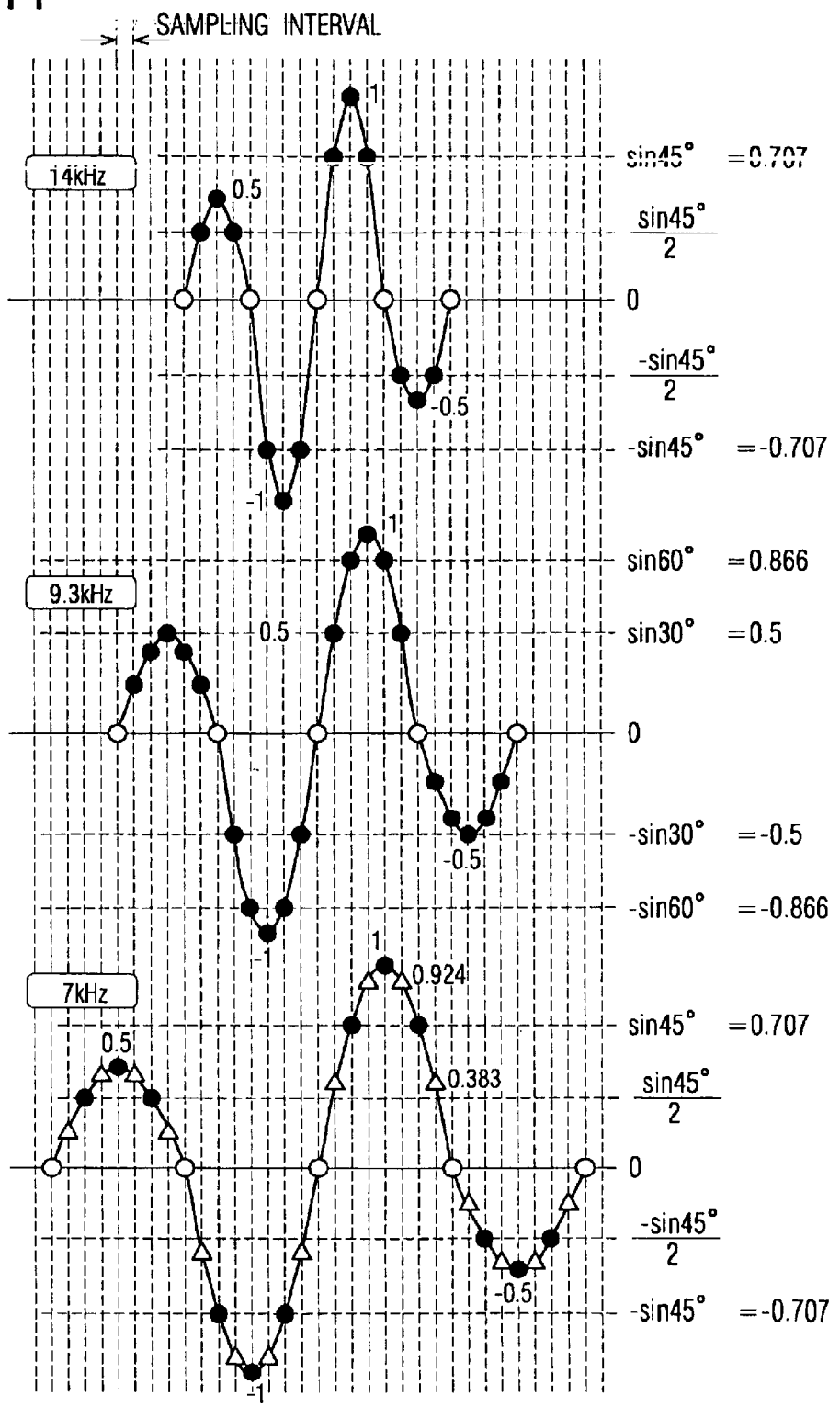
FIG. 11 is a diagram showing relations between the filter frequencies of the 14 kHz filter, the 9.3 kHz filter and the 7 kHz filter, which are provided by the first embodiment, and the sampling timing.
Figure 12:
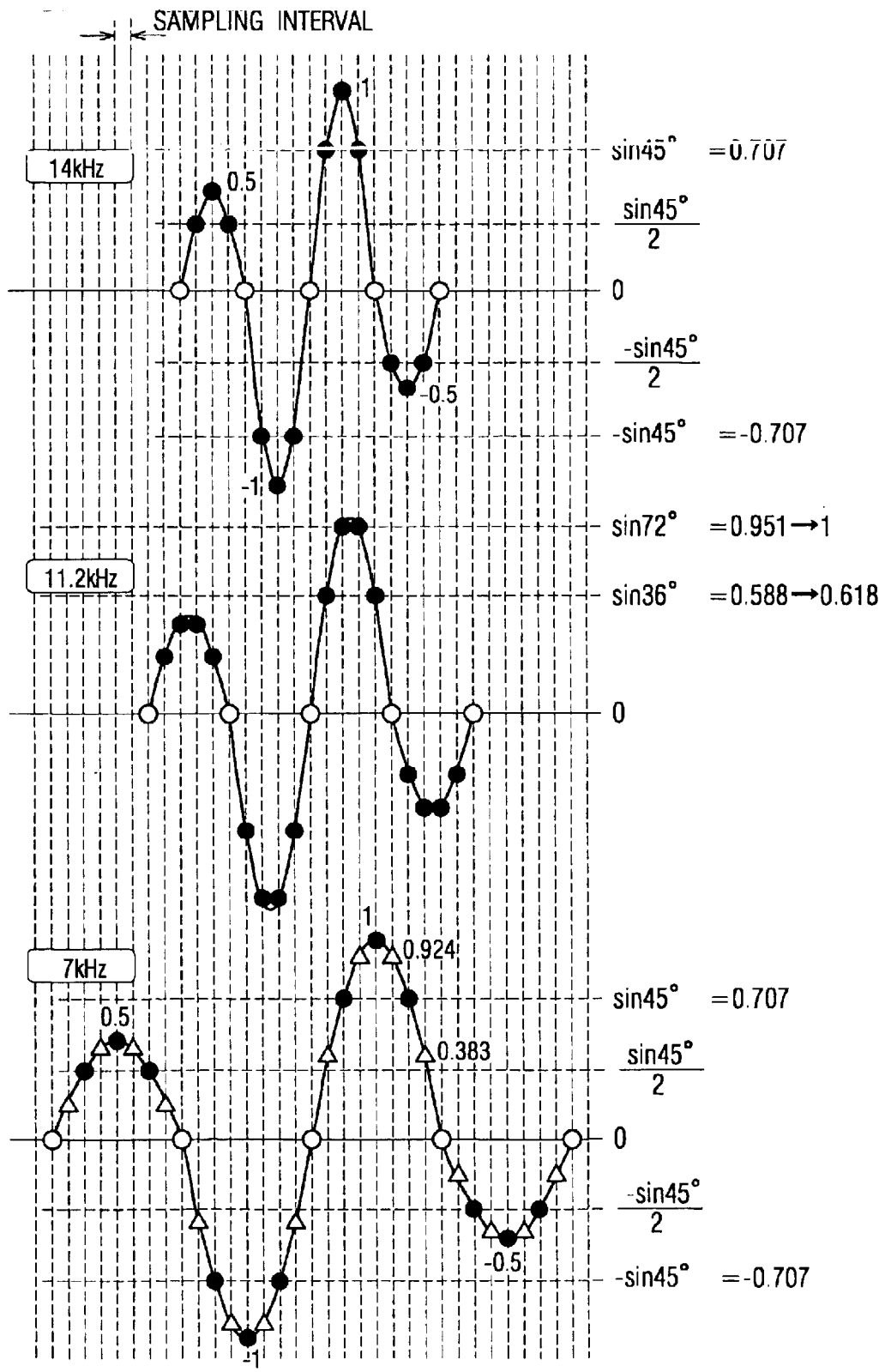
FIG. 12 is a diagram showing relations between the filter frequencies of the 14 kHz filter, the 11.2 kHz filter and the 7 kHz filter, which are provided by the first embodiment, and the sampling timing.

As described above, in the design of the 7 kHz filter 34-1, the 14 kHz filter 34-2, the 9.3 kHz filter 34-3 and the 11.2 kHz filter 34-4 according to the first embodiment, a left-right inverted symmetrical reference waveform described in paragraph (1-1) is created as a waveform corresponding to the waveform of the wavelet function. In addition, the sampling frequency is set at 112 kHz, which is an even multiple of the least common multiple of the filter frequencies of 7 kHz, 9.3 kHz, 11.2 kHz and 14 kHz as is obvious from FIGS. 11 and 12 showing relations between the filter frequencies of the 7 kHz filter 34-1 to the 11.2 kHz filter 34-4 and the sampling timing (the A/D conversion timing of the A/D converter 33). In addition, as described in paragraph (1-3), the 7 kHz filter 34-1, the 14 kHz filter 34-2, the 9.3 kHz filter 34-3 and the 11.2 kHz filter 34-4 are each designed so that the filter coefficients of each the filters are equal to values of their respective mince points on the left-right inverted symmetrical reference waveform, which are obtained as a result of mincing the waveform as described in paragraph (1-1) at intervals each equal to the sampling period T.

In each of the 7 kHz filter 34-1 to the 11.2 kHz filter 34-4, which are employed in the knock sensor signal processing apparatus 31 implemented by the first embodiment as described above, zero-cross points on the reference waveform used for determining filter coefficients are all taken as mince points and, since multiplicand coefficient for the outputs of delay units 41 associated with the zero-cross mince points are each zero, it is not necessary to carry out processing for the delay units 41. That is, if the sign of the (m−1)th coefficient h(m−1) is different from the sign of the (m+1)th coefficient h(m+1), the mth coefficient h(m) is 0.

In addition, there are at least 4 filter coefficients having the same absolute value for each of the 7 kHz filter 34-1 to the 11.2 kHz filter 34-4. In the case of the 9.3 kHz filter 34-3 shown in FIG. 8, for example, the absolute values of 6 coefficients for data 3, data 7, data 11, data 13, data 17 and data 21 are all 0.5 whereas the absolute values of 4 filter coefficients for data 1, data 5, data 19 and data 23 are all 0.25. Outputs of delay units corresponding to such 4 or more coefficients can be subjected to addition and subtraction operations first before multiplying the outputs by the absolute values of the coefficients.

In addition, in the filters 34-1 to 34-4, the output of a delay unit 41 corresponding to a mince point at the vertex of wave A is subjected to addition and subtraction operations as it is without a multiplication while the output of a delay unit 41 corresponding to a mince point at the vertex of wave B is multiplied by ½ by being shifted to the right by 1 bit.

As is obvious from the above description, each of the 7 kHz filter 34-1 to the 11.2 kHz filter 34-4, which are employed in the knock sensor signal processing apparatus 31 implemented by the first embodiment, can be implemented by an even number of delay units, 2 to 3 right-shift units, several addition & subtraction units and a multiplication unit. In such an implementation, the filter-processing load can be reduced to an amount that can be carried out by an ordinary microcomputer with ease.

If each sampled data (that is, each A/D conversion value) has a predetermined offset component, the sampled data is used after the offset components are mutually canceled by the addition (+) and subtraction (−) operations as shown in FIG. 4 and other figures. Since the offset components do not appear in the final result, the precision of the filter is improved.

In addition, in the first embodiment, the filter frequencies of 7 kHz and 14 kHz are related to each other in that one of the filter frequencies is a multiple of (n times, where n=2 in this case) the other filter frequency. In this case, the 7 kHz filter 34-1 can be designed by employing a pair of delay units 41a and 41b connected to each other in series as a substitute for each delay unit 41 employed in the 14 kHz filter 34-2, which has a filter frequency of 14 kHz equal to twice the 7 kHz filter frequency of the 7 kHz filter 34-1. As a result, the design of all the filters is easy and the number of computations carried out by the 7 kHz filter 34-1 can be reduced substantially. It is to be noted that this technique can be applied not only to the 2-times relation between filter frequencies but also to any multiple relation. For example, this technique can also be applied to a 7-times relation between filter frequencies. Concretely, if the knock sensor signal processing apparatus 31 employs a filter having a filter frequency of 2 kHz and a filter having a filter frequency of 14 kHz, for example, the 2 kHz filter can be designed by replacing each delay unit employed in the 14 kHz filter with 7 delay units connected to each other in series.

Second Embodiment

The knock sensor signal processing apparatus 31 implemented by a second embodiment is designed by employing the 7 kHz filter 34-1 and the 14 kHz filter 34-2 as frequency sampling filters. The 7 kHz filter 34-1 and the 14 kHz filter 34-2 are each designed as follows.

Figure 13:
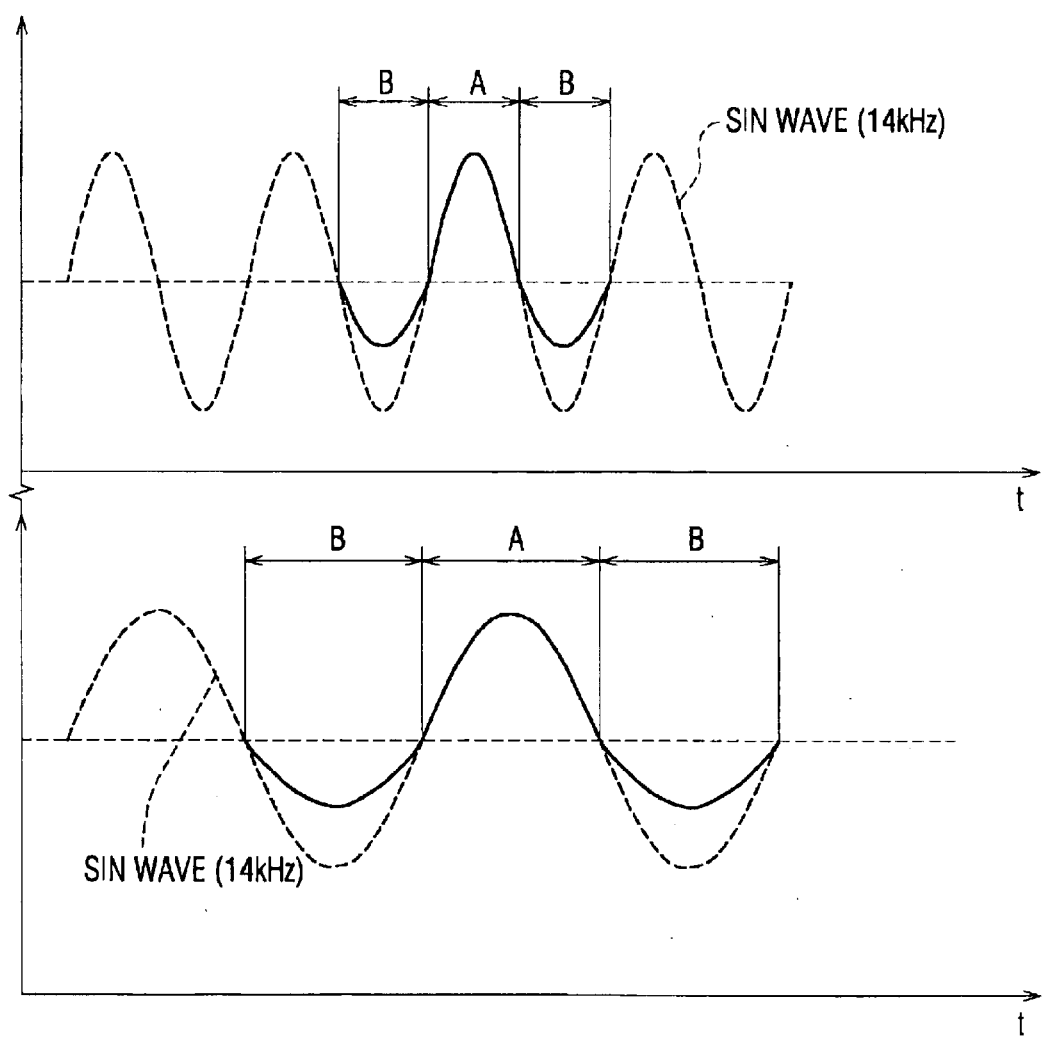
FIG. 13 is an explanatory diagram used for describing a method provided by a second embodiment to create a reference waveform corresponding to the waveform of a wavelet function of a frequency filter.

(2-1): First of all, the reference waveform of the wavelet function for each of the 7 kHz filter 34-1 and the 14 kHz filter 34-2 is created by concatenation of half waves of a sinusoidal waveform having a frequency equal to the filter frequency of the filter as shown in FIG. 13.

In the case of the 14 kHz filter 34-2, the reference waveform is created by concatenating waves A and B in the following order: wave B followed by wave A followed by wave B as shown in the upper diagram of FIG. 13 where wave B denotes a negative half wave of a sinusoidal waveform with a frequency of 14 kHz and a peak value of ½ while wave A denotes a positive half wave of a sinusoidal waveform with a frequency of 14 kHz and a peak value of 1. The resulting reference waveform is a left-right symmetrical waveform including 1 wave A and 2 waves B.

In the case of the 7 kHz filter 34-1, the reference waveform is created by concatenating waves A and B in the following order: wave B followed by wave A followed by wave B as shown in the lower diagram of FIG. 13 where wave B denotes a negative half wave of a sinusoidal waveform with a frequency of 7 kHz and a peak value of ½ while wave A denotes a positive half wave of a sinusoidal waveform with a frequency of 7 kHz and a peak value of 1. The resulting reference waveform is a left-right symmetrical waveform including 1 wave A and 2 waves B. It is to be noted that the waveform shown in the lower diagram of FIG. 13 is obtained by magnifying the waveform shown in the upper diagram of FIG. 13 at a scaling factor of 2 in the horizontal direction.

That is, in the second embodiment, a left-right symmetrical waveform is used as the waveform of the basic wavelet function. As described above, the left-right symmetrical waveform is created by concatenating waves A and B in the following order: wave B followed by wave A followed by wave B where wave A is a positive half wave of a sinusoidal waveform with a peak value of 1 while wave B is a negative half wave of a sinusoidal waveform with a peak value of ½.

(2-2): Also in the case of the second embodiment, the sampling frequency of the A/D converter 33 is a common multiple of the filter frequencies of 7 kHz and 14 kHz. Concretely, the sampling frequency is set at an even multiple of the least common multiple of the filter frequencies. Since the filter frequencies are 7 kHz and 14 kHz, their least common multiple is 28 kHz. In the case of the second embodiment, the sampling frequency is set at an even multiple of the least common multiple. Concretely, the sampling frequency is set at 112 kHz (=4×28 kHz=8×14 kHz) much like the first embodiment.

(2-3): Also in the case of the second embodiment, the frequency-sampling filters 34-1 and 34-2 are each a FIR filter having an impulse response with a finite length. Each of the frequency-sampling filters 34-1 and 34-2 is designed so that values of mince points are equal to coefficients of the filter. A mince point is a point on the left-right symmetrical reference waveform created in paragraph (2-1) described above. A mince point is obtained as a result of mincing the left-right symmetrical reference waveform at sampling intervals T, starting from an end of the waveform. The concrete configurations of the frequency-sampling filters 34-1 and 34-2 are explained as follows.

Figure 14:
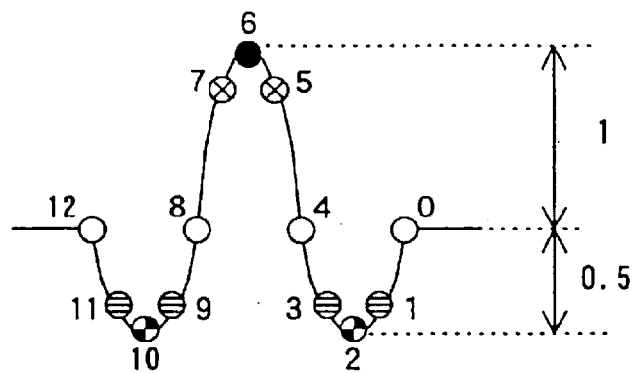
FIG. 14 is a diagram showing mince points on a reference waveform for a 14 kHz filter provided by the second embodiment.

(2-3-1): First of all, in the case of the 14 kHz filter 34-2, mince points on the reference waveform are numbered 0 to 12 as shown in FIG. 14. The mince points are obtained by mincing the reference waveform, starting from its end at phase intervals of 45 degrees to divide the reference waveform into 12 segments. The 14 kHz filter 34-2 is then designed into a configuration shown in FIG. 15 wherein the coefficients of the 14 kHz filter 34-2 are equal to the values of the mince points shown in FIG. 14.

Figure 15:
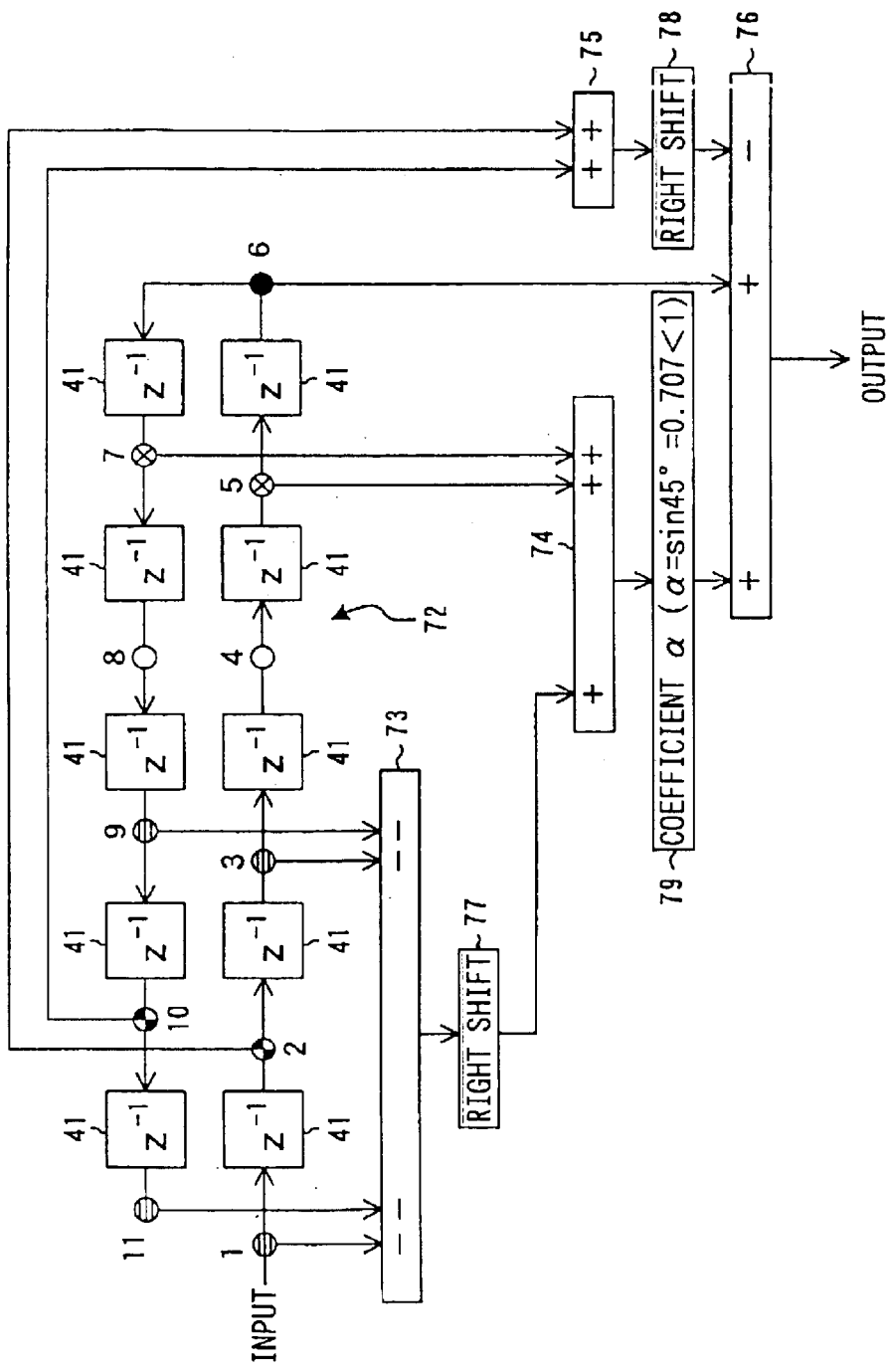
FIG. 15 is a block diagram showing the configuration of the 14 kHz filter provided by the second embodiment.

As shown in FIG. 15, the 14 kHz filter 34-2 comprises a delay-unit group 72, addition & subtraction units 73, 74, 75 and 76, 2 right-shift units 77 and 78 as well as a multiplication unit 79. The delay-unit group 72 comprises 10 delay units 41 connected to each other in series so that each of the delay units 41 outputs its output lagging behind its input by the sampling period T. The delay unit 41 at the first stage receives pieces of sampled data sequentially from the A/D converter 33. Each of the right-shift units 77 and 78 shifts an input to the right by 1 bit and outputs the shifted input. The multiplication unit 79 multiplies its input by a coefficient α of 0.707, which is the value of sin 45 degrees.

Let data 1 be the input to the delay unit 41 at the first stage and data 2 be the output from the delay unit 41 at the second stage whereas data 3, data 4, . . . and data 11 be outputs of respectively the delay units 41 subsequently following the delay unit 41 at the second stage in the delay-unit group 72. In the 14 kHz filter 34-2, the addition & subtraction unit 73 carries out addition and subtraction operations of '−data 1−data 3−data 9−data 11.' The output of the addition & subtraction unit 73 is shifted to the right by 1 bit by the right-shift unit 77 to produce ½ the value of the output.

Then, the addition & subtraction unit 74 carries out addition and subtraction operations of 'the output of the right-shift unit 77+data 5+data 7.' The multiplication unit 79 multiplies the output of the addition & subtraction unit 74 by the value (=0.707) of sin 45 degrees.

In addition, the addition & subtraction unit 75 carries out an addition operation of 'data 2+data 10.' The output of the addition & subtraction unit 75 is shifted to the right by 1 bit by the right-shift unit 78 to produce ½ the value of the output. Furthermore, the addition & subtraction unit 76 carries out addition and subtraction operations of 'the output of the multiplication unit 79+data 6−the output of the right-shift unit 78.' The output of the addition & subtraction unit 76 is the output of the 14 kHz filter 34-2.

Let mince points numbered 0 to 12 as shown in FIG. 14 be called mince point 0, mince point 1, mince point 2, . . . mince point 11 and mince point 12 respectively. In this case, in the 14 kHz filter 34-2, the filter coefficients are equal to the values of the mince points shown in FIG. 14. Specifically, the filter coefficient for data 1 is the value (=−sin 45 degrees/2) of mince point 1, the filter coefficient for data 2 is the value (=−0.5) of mince point 2 . . . the filter coefficient for data 5 is the value (=sin 45 degrees) of mince point 5, the filter coefficient for data 6 is the value (=1) of mince point 6 . . . and the filter coefficient for data 11 is the value (=−sin 45 degrees/2) of mince point 11.

It is to be noted that 4 mince points 0, 4, 8 and 12, which are each marked by a white circle symbol ○ shown in FIG. 14, are each a zero-cross point of the reference waveform. Thus, no delay units are provided for mince points 0 and 12. In addition, outputs of the fourth and eighth delay units 41 corresponding to mince points 4 and 8 respectively are each associated with a multiplicand coefficient of 0 in order to exclude them from processing.

Figure 16:
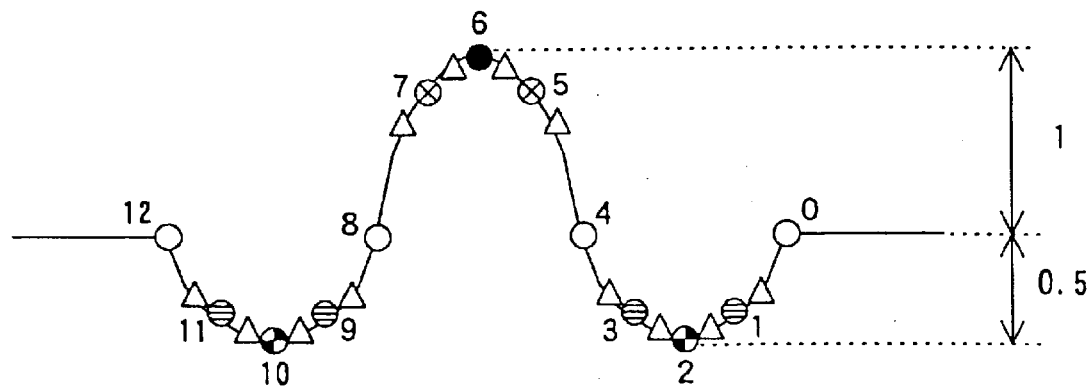
FIG. 16 is a diagram showing mince points on a reference waveform for a 7 kHz filter provided by the second embodiment.
Figure 17:
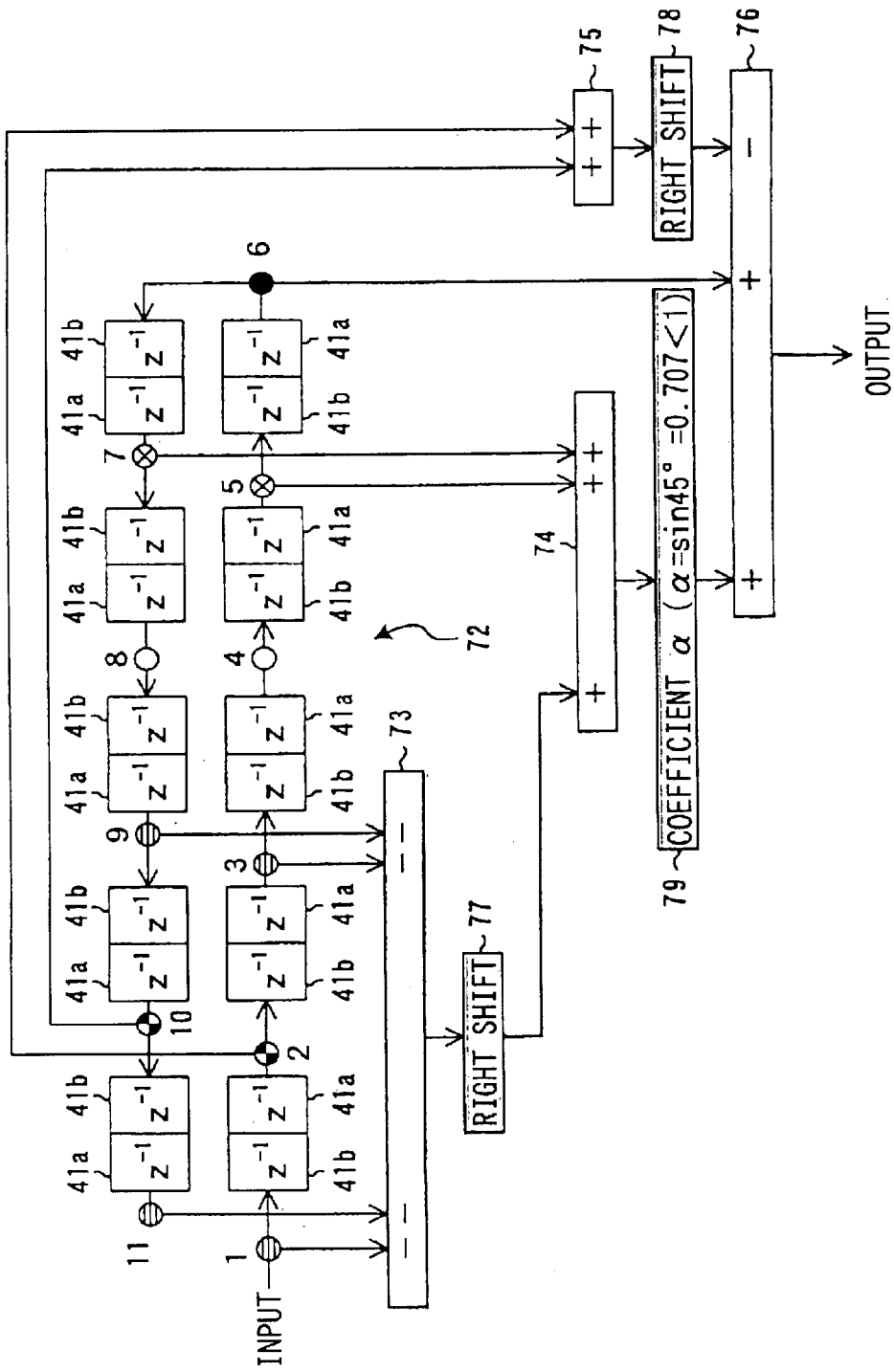
FIG. 17 is a block diagram showing the configuration of the 7 kHz filter provided by the second embodiment.

(2-3-2): Next, in the case of the 7 kHz filter 34-1, mince points on the reference waveform are points numbered 0 to 12 and points each marked with a triangle symbol Δ as shown in FIG. 16. Mince points 0 to 12 are obtained by mincing the reference waveform, starting from its end at phase intervals of 45 degrees to divide the reference waveform into 12 segments. On the other hand, the points each marked with a triangle symbol Δ are each a point with an intermediate phase between 2 adjacent numbered mince points. The 7 kHz filter 34-1 is then designed into a configuration shown in FIG. 17 wherein the coefficients of the 7 kHz filter 34-1 are equal to the values of some selected specific ones of the mince points shown in FIG. 16. If the mince points each marked with a triangle symbol Δ are excluded from the selection of the specific mince points, the specific mince points are points at every other numbered mince point.

That is, the 7 kHz filter 34-1 is designed by replacing each delay unit 41 of the delay-unit group 72 employed in the 14 kHz filter 34-2 shown in FIG. 15 with a pair of delay units 41a and 41b connected to each other in series. The rest is the same as the configuration of the 14 kHz filter 34-2. In other words, much like the first embodiment, the number of delay units employed in the 7 kHz filter 34-1 of the second embodiment is twice the number of delay units employed in the 14 kHz filter 34-2. In addition, in the case of the 7 kHz filter 34-1, outputs of the delay units are thinned by selecting only an output for every other delay unit 41. That is, only outputs of every other delay unit 41 are used in the filter processing.

Let mince points numbered 0 to 12 shown in FIG. 16 be called mince point 0, mince point 1, mince point 2, . . . mince point 11 and mince point 12 respectively. In this case, in the 7 kHz filter 34-1, the values of mince points 1 to 11 are equal to coefficients for which each pair of delay units 41a and 41b is used as a delay unit introducing a delay time of 2 sampling periods (=2×T).

It is to be noted that the mince points each marked with a triangle symbol Δ in FIG. 16 are excluded from the filter processing by the process to thin the outputs of the delay units 41 as described above. Thus, the outputs of the delay units 41 each corresponding to one of the mince points each marked with a triangle symbol Δ are excluded from the filter processing in the 7 kHz filter 34-1 shown in FIG. 17. The delay units 41 are each the delay unit 41b added to the configuration shown in FIG. 15.

As described above, in the design of the 7 kHz filter 34-1 and the 14 kHz filter 34-2 according to the second embodiment, a left-right symmetrical reference waveform described in paragraph (2-1) is created as a waveform corresponding to the waveform of the wavelet function. In addition, much like the first embodiment, the sampling frequency is set at 112 kHz, which is an even multiple of the least common multiple of the filter frequencies of 7 kHz and 14 kHz. In addition, the 7 kHz filter 34-1 and the 14 kHz filter 34-2 are each designed so that the coefficients of each of the filters are equal to values of their respective mince points on the left-right symmetrical reference waveform, which are obtained as a result of mincing the waveform described in paragraph (2-1) at intervals each equal to the sampling period T.

In the 7 kHz filter 34-1 and the 14 kHz filter 34-2 employed in the knock sensor signal processing apparatus 31 implemented by the second embodiment, if the sign of the (m−1)th coefficient h(m−1) is different from the sign of the (m+1)th coefficient h(m+1), the mth coefficient h(m) is 0.

In addition, there are at least 4 filter coefficients having the same absolute value for each of the 7 kHz filter 34-1 and the 14 kHz filter 34-2. In the case of the 14 kHz filter 34-2 shown in FIG. 15, for example, the absolute values of 4 filter coefficients for data 1, data 3, data 9 and data 11 are all sin 45 degrees/2.

Furthermore, each of the 7 kHz filter 34-1 to the 14 kHz filter 34-2, which are employed in the knock sensor signal processing apparatus 31 implemented by the second embodiment, can be implemented by an even number of delay units, 2 right-shift units, several addition & subtraction units and a multiplication unit. In such an implementation, the filter-processing load can be reduced to an amount that can be carried out by an ordinary microcomputer with ease.

In addition, also in the case of the second embodiment, the 7 kHz filter 34-1 can be designed by employing a pair of delay units 41a and 41b connected to each other in series as a substitute for each delay unit 41 of the delay-unit group 72 employed in the 14 kHz filter 34-2, which has a filter frequency of 14 kHz equal to twice the 7 kHz filter frequency of the 7 kHz filter 34-1. As a result, the design of all the filters is easy and the number of computations carried out by the 7 kHz filter 34-1 can be reduced substantially.

It is to be noted that, even though the typical configuration described above includes only the 7 kHz filter 34-1 and the 14 kHz filter 34-2, the description holds true of the design a filter having a filter frequency equal to the frequency of 1.5th-order harmonic wave of the knock fundamental wave, that is, a filter having a filter frequency in the range 9 kHz to 11 kHz. By adding a filter having a filter frequency equal to the frequency of 1.5th-order harmonic wave of the knock fundamental wave to the knock sensor signal processing apparatus 31 as is the case with the first embodiment, it is possible to raise the degree of precision with which a knocking is detected.

In addition, in the case of the second embodiment, a left-right symmetrical waveform is used as a reference waveform corresponding to the wavelet function. However, the left-right symmetrical inverted waveform like the one used in the first embodiment further raises the degree of precision, at which a knocking is detected, and is thus more advantageous. This is because the knock-sensor signal generally vibrates up and down with a reference point taken as a center and it is possible to provide a frequency sampling filter, the output value of which properly reacts to a waveform pattern of such a knock-sensor signal.

Third Embodiment

In the knock sensor signal processing apparatus 31 implemented by a third embodiment, the frequency-sampling filters 34 are designed to comprise a 7 kHz filter 34-1, a 14 kHz filter 34-2 and a 10.5 kHz filter 34-5. The 10.5 kHz filter 34-5 is a filter having its filter frequency equal to the frequency of a 1.5th-order harmonic wave of the knock fundamental wave. The frequency of the 1.5th-order harmonic wave is 10.5 kHz.

The 7 kHz filter 34-1, the 14 kHz filter 34-2 and the 10.5 kHz filter 34-5 are each designed as follows.

Figure 18:
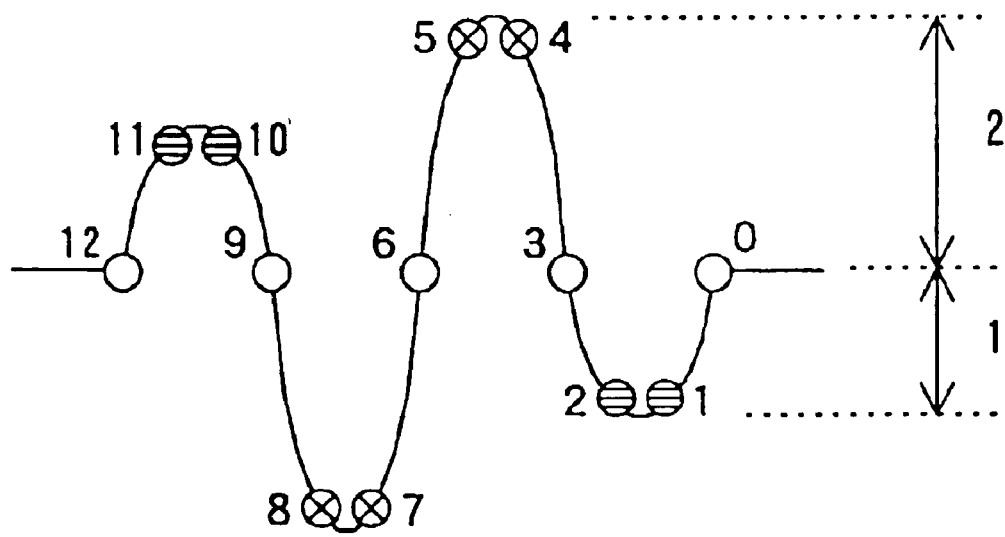
FIG. 18 is a diagram showing mince points on a reference waveform for a 14 kHz filter provided by a third embodiment.

(3-1): First of all, the reference waveform of the wavelet function for each of the 7 kHz filter 34-1, the 14 kHz filter 34-2 and the 10.5 kHz filter 34-5 is created by concatenation of half waves of a sinusoidal waveform having a frequency equal to the filter frequency of the filter in the same way as that described in paragraph (1-1) for the first embodiment. In the case of the third embodiment, however, the peak value of wave A is 2 and the peak value of wave B is thus 1 instead of 0.5 as shown in FIG. 18.

(3-2): Also in the case of the third embodiment, the sampling frequency of the A/D converter 33 is a common multiple of the filter frequencies of 7 kHz, 10.5 kHz and 14 kHz. Concretely, the sampling frequency is set at an even multiple of the least common multiple of the filter frequencies. Since the filter frequencies are 7 kHz, 10.5 kHz and 14 kHz, their least common multiple is 42 kHz. In the case of the third embodiment, the sampling frequency is set at an even multiple of the least common multiple. Concretely, the sampling frequency is set at 84 kHz (=2×42 kHz=6×14 kHz). The sampling frequency of 84 kHz is 8 times 10.5 kHz and 12 times 7 kHz.

(3-3): Also in the case of the third embodiment, the frequency-sampling filters 34-1, 34-2 and 34-5 are each a FIR filter having an impulse response with a finite length. Each of the frequency-sampling filters 34-1, 34-2 and 34-5 is designed so that values of mince points are equal to coefficients of the filter. A mince point is a point on the left-right inverted symmetrical reference waveform created in paragraph (3-1) described above. A mince point is obtained as a result of mincing the left-right inverted symmetrical reference waveform at sampling intervals T, starting from an end of the waveform. The concrete configurations of the frequency-sampling filters 34-1, 34-2 and 34-5 are explained as follows.

(3-3-1): First of all, in the case of the 14 kHz filter 34-2, mince points on the reference waveform are numbered 0 to 12 as shown in FIG. 14. The mince points are obtained by mincing the reference waveform, starting from its end at phase intervals of 60 degrees to divide the reference waveform into 12 segments. The 14 kHz filter 34-2 is then designed into a configuration shown in FIG. 19 wherein the coefficients of the 14 kHz filter 34-2 are equal to the values of the mince points shown in FIG. 18.

Figure 19:
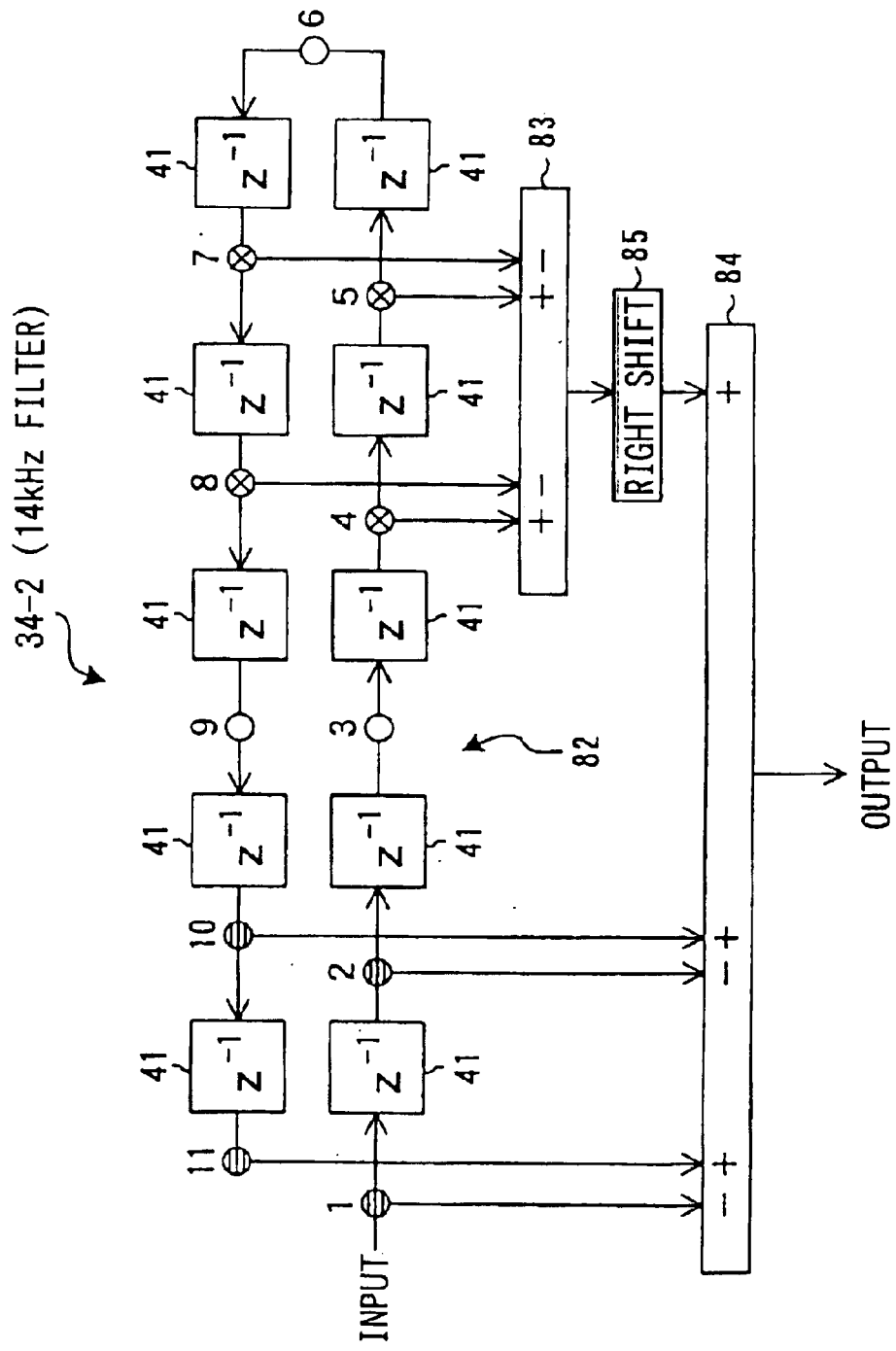
FIG. 19 is a block diagram showing the configuration of the 14 kHz filter provided by the third embodiment.

As shown in FIG. 19, the 14 kHz filter 34-2 comprises a delay-unit group 82, addition & subtraction units 83 and 84 as well as a left-shift unit 85. The delay-unit group 82 comprises 10 delay units 41 connected to each other in series so that each of the delay units 41 outputs its output lagging behind its input by the sampling period T. The delay unit 41 at the first stage receives pieces of sampled data sequentially from the A/D converter 33. The left-shift unit 85 shifts an input to the left by 1 bit and outputs the shifted input.

Let data 1 be the input to the delay unit 41 at the first stage and data 2 be the output from the delay unit 41 at the second stage whereas data 3, data 4, . . . and data 11 be outputs of respectively the delay units 41 subsequently following the delay unit 41 at the second stage in the delay-unit group 82. In the 14 kHz filter 34-2, the addition & subtraction unit 83 carries out addition and subtraction operations of 'data 4+data 5−data 7−data 8.' The output of the addition & subtraction unit 83 is shifted to the left by 1 bit by the left-shift unit 85 to produce 2 times the value of the output. It is to be noted that the output of the addition & subtraction unit 83 is shifted to the left by 1 bit by the left-shift unit 85 because, in the 14 kHz filter 34-2 of the third embodiment, the value (=0.866) of sin 60 degrees is normalized to 1 and, thus, data 4, data 5, data 7 and data 8 which should be naturally be multiplied by a coefficient of 2×sin 60 degrees need to be multiplied by 2.

Then, in the 14 kHz filter 34-2 of the third embodiment, the addition & subtraction unit 84 carries out addition and subtraction operations of 'the output of the left-shift unit 85−data 1−data 2+data 10+data 11.' The output of the addition & subtraction unit 84 is the output of the 14 kHz filter 34-2. It is to be noted that data 1, data 2, data 10 and data 11 are not multiplied by sin 60 degrees because the value of sin 60 degrees is normalized to 1 as described above.

Let mince points numbered 0 to 12 as shown in FIG. 18 be called mince point 0, mince point 1, mince point 2, . . . mince point 11 and mince point 12 respectively. In this case, in the 14 kHz filter 34-2, the filter coefficients are equal to products of the values of the mince points 1 to 11 shown in FIG. 18 and 1/sin 60 degrees and, as described above, the value of sin 60 degrees is normalized to 1 and the product 2×sin 60 degrees is thus equal to 2. Specifically, the coefficients (=−1) for data 1 and data 2 are (1/sin 60 degrees) times the values of mince points 1 and 2 respectively, the coefficients for data 3, data 6 and data 9 are each 0, which is the values of mince point 3, 6 and 9, the coefficients (=2) for data 4 and data 5 are (1/sin 60 degrees) times the value of mince points 4 and 5 respectively, the coefficients (=−2) for data 7 and data 8 are (1/sin 60 degrees) times the values of mince points 7 and 8 respectively and the coefficients (=1) for data 10 and data 11 are (1/sin 60 degrees) times the values of mince points 10 and 11 respectively.

It is to be noted that 5 mince points 0, 3, 6, 9 and 12, which are each marked by a white circle symbol ○ shown in FIG. 18, are each a zero-cross point of the reference waveform. Thus, no delay units are provided for mince points 0 and 12. In addition, outputs of the second, fifth and eighth delay units 41 corresponding to mince points 3, 6 and 9 respectively are each associated with a multiplicand coefficient of 0 in order to exclude them from processing.

(3-3-2): The configuration of the 7 kHz filter 34-1 is shown in none of the figures. However, the 7 kHz filter 34-1 is designed into a configuration having the same relation with the configuration of the 14 kHz filter 34-2 shown in FIG. 19 as the relation between the configurations shown in FIGS. 6 and 4 for the first embodiment. Concretely, the 7 kHz filter 34-1 is designed by replacing each delay unit 41 of the delay-unit group 82 employed in the 14 kHz filter 34-2 shown in FIG. 19 with a pair of delay units 41a and 41b connected to each other in series. The rest is the same as the configuration of the 14 kHz filter 34-2. In other words, much like the first embodiment, the number of delay units employed in the 7 kHz filter 34-1 of the third embodiment is twice the number of delay units employed in the 14 kHz filter 34-2. In addition, in the case of the 7 kHz filter 34-1, outputs of the delay units are thinned by selecting only an output for every other delay unit 41. That is, only outputs of every other delay unit 41 are used in the filter processing.

Figure 20:
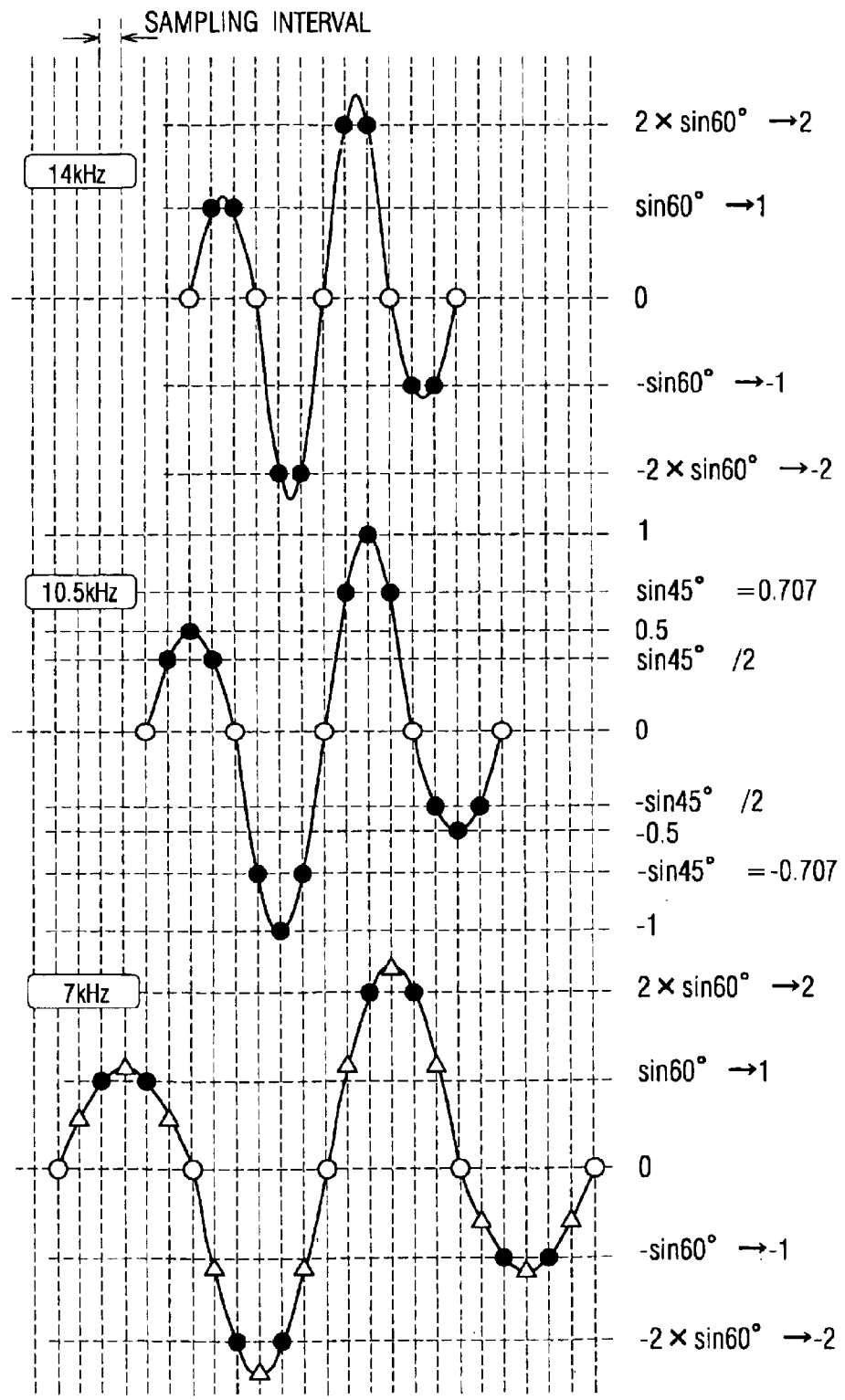
FIG. 20 is a diagram showing relations between the filter frequencies of the 14 kHz filter, the 10.5 kHz filter and the 7 kHz filter, which are provided by the third embodiment, and the sampling timing.

(3-3-3): Then, the 10.5 kHz filter 34-5 is designed into the same configuration as the first embodiment's 14 kHz filter 34-2 shown in FIG. 4. This is because, as is obvious from FIG. 20 showing relations between the filter frequencies of the 7 kHz filter 34-1, 34-2 and 34-5 and the sampling frequency, in the case of the third embodiment, the sampling frequency is 8 times the filter frequency (10.5 kHz) of the 10.5 kHz filter 34-5 as the sampling frequency is 8 times the filter frequency of the 14 kHz filter 34-2 in the first embodiment as shown in FIGS. 11 and 12.

It is to be noted that if the 10.5 kHz filter 34-5 is designed into exactly the same configuration as the first embodiment's 14 kHz filter 34-2 shown in FIG. 4, the gain of the output value of the 10.5 kHz filter 34-5 will be half the gains of the output values of the other filters, namely, the 7 kHz filter 34-1 and the 14 kHz filter 34-2. Thus, in order to make the gain of the output value of the 10.5 kHz filter 34-5 equal to the gains of the output values of the 7 kHz filter 34-1 and the 14 kHz filter 34-2, in the case of the 10.5 kHz filter 34-5, a left-shift unit is added for shifting the output of the addition & subtraction unit 46 by 1 bit to the configuration shown in FIG. 4 and the output of the left-shift unit is used as the output of the 10.5 kHz filter 34-5.

As described above, each of the 7 kHz filter 34-1 and the 14 kHz filter 34-2, which are employed in the knock sensor signal processing apparatus 31 implemented by the third embodiment, can be implemented by only an even number of delay units, a left-shift unit and several addition & subtraction units. In the 7 kHz filter 34-1 and the 14 kHz filter 34-2, no multiplication is carried out so that the filter-processing load can be further reduced than the first embodiment.

Fourth Embodiment

By the way, in the case of each of the first to third embodiments, the reference waveform corresponding to the waveform of the wavelet function of the filter 34 is created by concatenating half waves of sinusoidal waveform. As shown by example 1 on the left side of FIG. 21, however, the reference waveform can also be created by concatenating wave A and wave B where wave A is a full wave of a sinusoidal waveform having a frequency equal to the filter frequency and a peak value of 1 whereas wave B is a full wave of a sinusoidal waveform having a frequency equal to the filter frequency and a peak value equal to typically ½ the peak value of wave A.

Also in this case, much like the embodiments described previously, the sampling frequency is set at an even multiple of the filter frequencies and each of the filters 34 is designed so that values of mince points on the reference waveform consisting of waves A and B are equal to coefficients of the filter. A mince point is obtained as a result of mincing the reference waveform at sampling intervals T, starting from an end of the waveform. In the case of the fourth embodiment in particular, filter coefficients for pieces of input data are associated with mince points in such a way that the more recent the piece of input data, the closer the mince point to the reference waveform's start end, which is the reference waveform's end on the wave-B side. That is, the coefficient of the most recent input data is set at the value of a mince point at the reference waveform's end on the wave B side. On the other hand, the coefficient of the least recent input data is set at the value of a mince point at the reference waveform's end on the wave-A side.

Figure 21:
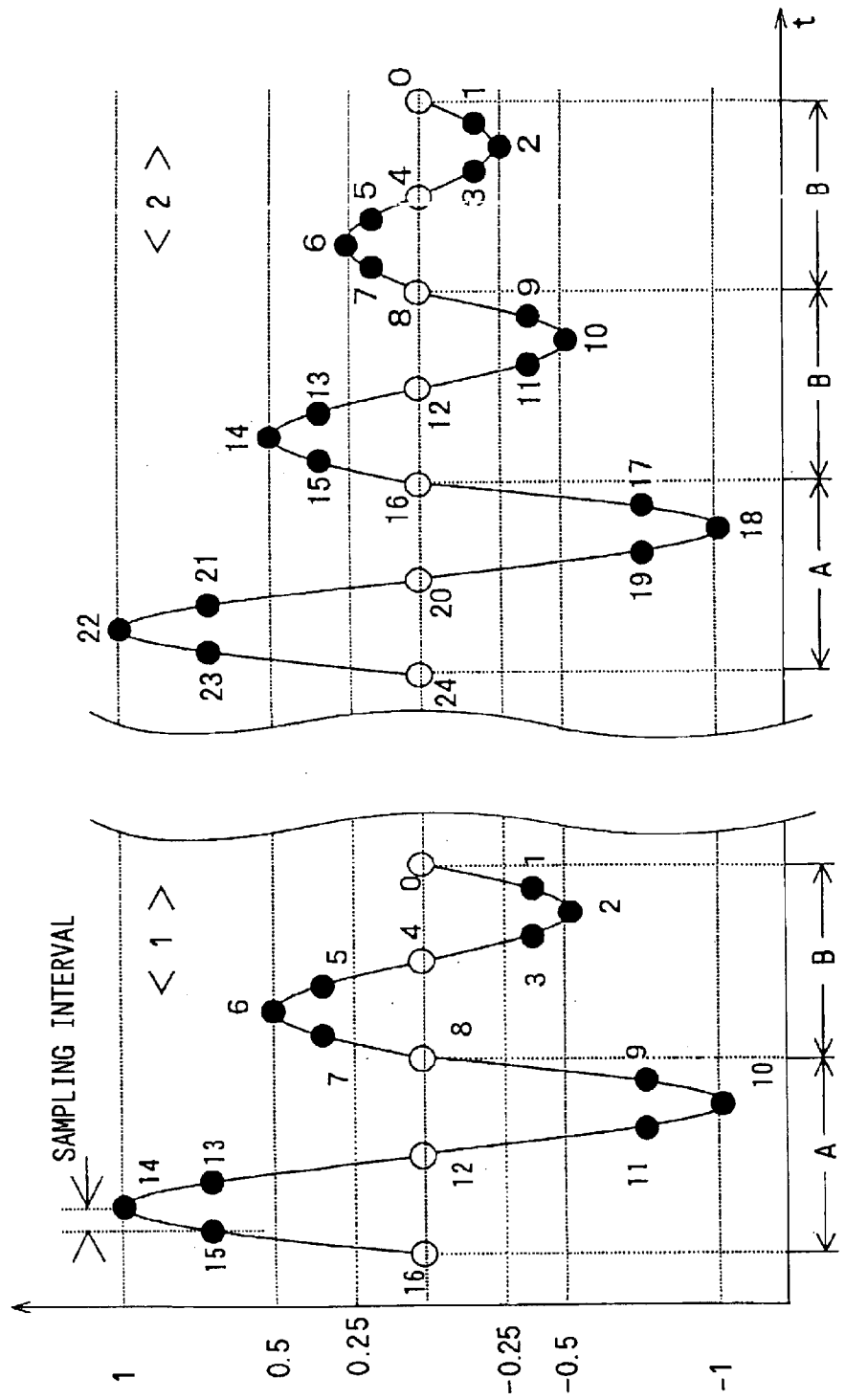
FIG. 21 is an explanatory diagram used for describing a fourth embodiment.

In the case of example 1 shown in FIG. 21, for example, the filter frequency, that is, the frequency of the reference waveform consisting of waves A and B, is 14 kHz whereas the sampling frequency is set at a frequency 8 times 14 kHz. The reference waveform is minced at sampling intervals T, starting from the waveform's end on the wave B side, and numbers 0 to 16 are assigned to the resulting mince points starting with the mince point at the waveform's end on the wave B side to give mince point 0, mince point 1, mince point 2, . . . , and mince point 16.

In addition, in this case, the 14 kHz filter 34-2 includes a delay-unit group 42 comprising 14 delay units 41 much like the first embodiment shown in FIG. 4. Let data 1 be the input to the delay unit 41 at the first stage and data 2 be the output from the delay unit 41 at the second stage whereas data 3, data 4 and so on be outputs of respectively the delay units 41 subsequently following the delay unit 41 at the second stage in the delay-unit group 82. In this case, coefficients need to be set as follows. The filter coefficient for data 1 received as the most recent input data is set at a value equal to the value (=−sin 45 degrees/2) of mince point 1. The filter coefficient for data 2 immediately preceding data 1 is set at a value equal to the value (=−0.5) of mince point 2. The filter coefficient for data 3 is set at a value equal to the value (=−sin 45 degrees/2) of mince point 3. The filter coefficient for data 4 is set at a value equal to the value (=0) of mince point 4. The filter coefficient for data 5 is set at a value equal to the value (=sin 45 degrees/2) of mince point 5. The filter coefficient for data 6 is set at a value equal to the value (=0.5) of mince point 6. The filter coefficient for data 7 is set at a value equal to the value (=sin 45 degrees/2) of mince point 7. The filter coefficient for data 8 is set at a value equal to the value (=0) of mince point 8. The filter coefficient for data 9 is set at a value equal to the value (=−sin 45 degrees) of mince point 9. The filter coefficient for data 10 is set at a value equal to the value (=−1) of mince point 10. The filter coefficient for data 11 received as the most recent input data is set at a value equal to the value (=−sin 45 degrees) of mince point 11. The filter coefficient for data 12 is set at a value equal to the value (=0) of mince point 12. The filter coefficient for data 13 is set at a value equal to the value (=sin 45 degrees) of mince point 13. The filter coefficient for data 14 is set at a value equal to the value (=1) of mince point 14. The filter coefficient for data 15 is set at a value equal to the value (=sin 45 degrees) of mince point 15.

That is, the 14 kHz filter 34-2 is designed by modifying the 14 kHz filter 34-2 shown in FIG. 4 as follows. In place of data 13, data 5 is supplied to the addition & subtraction unit 43. In place of data 13, data 5 is supplied to the addition & subtraction unit 43. In place of data 14, data 6 is supplied to the addition & subtraction unit 45. In place of data 15, data 7 is supplied to the addition & subtraction unit 43. In place of data 5, data 13 is supplied to the addition & subtraction unit 44. In place of data 6, data 14 is supplied to the addition & subtraction unit 46. In place of data 7, data 15 is supplied to the addition & subtraction unit 44. It is to be noted that the other filters 34 each having a different filter frequency can each be designed in the same way.

In addition, even if the filters 34 are designed in accordance with the fourth embodiment, the same effects as the first embodiment can be obtained. That is, each filter 34 can be implemented by an even number of delay units, 2 to 3 right-shift units, several addition & subtraction units and a multiplication unit. In such an implementation, the filter-processing load borne by the knock sensor signal processing apparatus 31 can be reduced to an amount that can be carried out by an ordinary microcomputer with ease.

Figure 26:
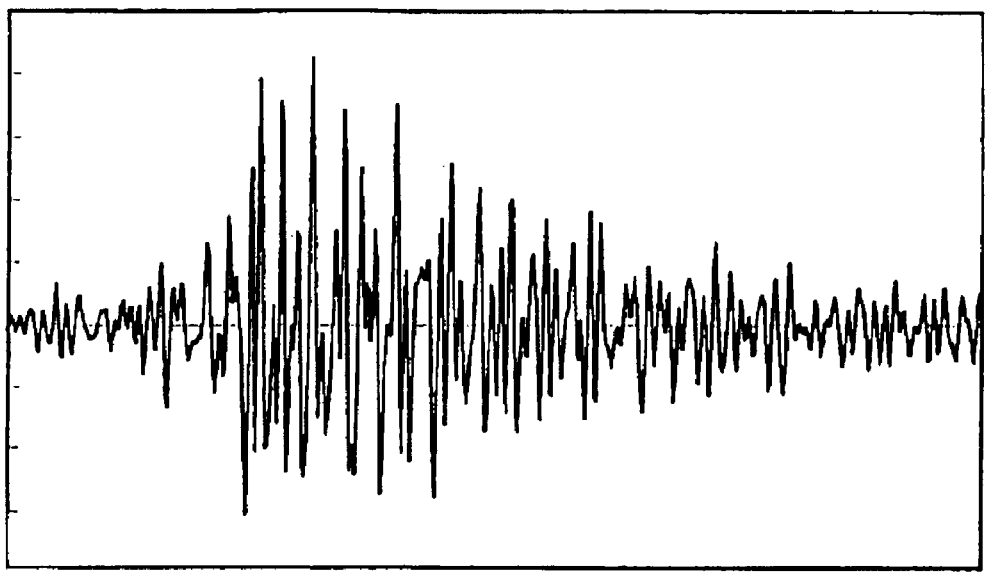
FIG. 26 is a diagram showing the waveform of a knock-sensor signal generated in the event of a knocking.

Furthermore, if each filter 34 is designed in accordance with the fourth embodiment, a waveform of an attenuation pattern obtained by concatenating waves A and B (where wave A is a full wave of a sinusoidal waveform and wave B is also a full wave of a sinusoidal waveform having a peak value smaller than that of wave A) becomes a reference waveform corresponding to the waveform of the wavelet function. Thus, the degree of precision with which a knocking is detected can be raised for the following reason. As shown in FIG. 26, when a knocking is generated, the knock-sensor signal exhibits a pattern showing vibration at initial large amplitudes, which gradually become smaller thereafter. This embodiment implements frequency sampling filters each having an output value that properly reacts to the attenuated waveform pattern of the knock-sensor signal.

It is to be noted that, in the case of the fourth embodiment, the number of waves B constituting the reference waveform of the filter 34 is not limited to 1 and wave B is not limited to one type either. As shown by example 2 on the right side of FIG. 21, for instance, a reference waveform is obtained by adding another wave B having a peak value equal to ¼ of the peak value of wave A to the reference waveform of example 1 as a third wave on the right side of the reference waveform of example 1, that is, a third wave on first wave B's side opposite to the side close to wave A, where first wave B is wave B having a peak value equal to ½ of the peak value of wave A.

Fifth Embodiment

Figure 6:
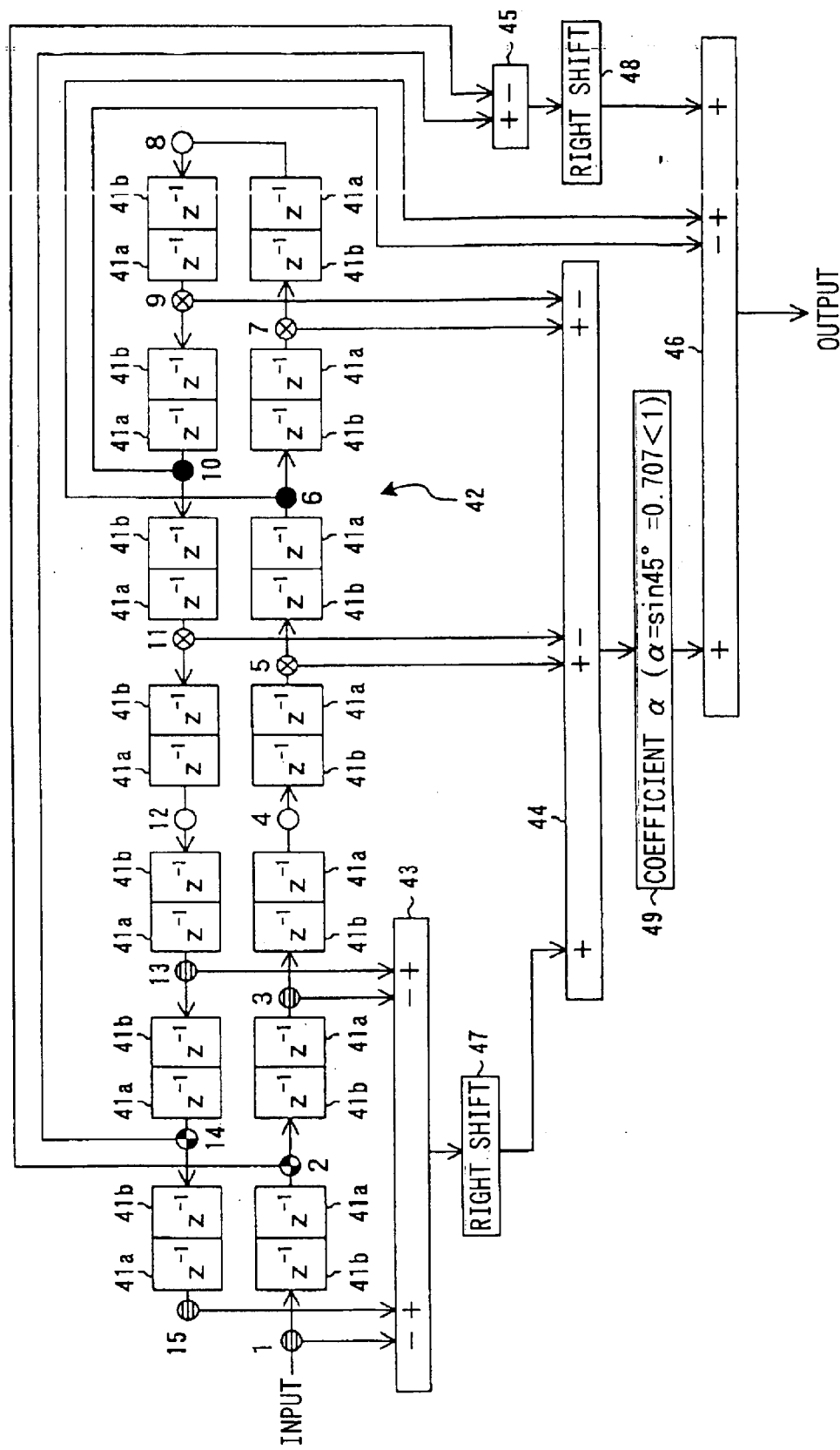
FIG. 6 is a block diagram showing the configuration of the 7 kHz filter provided by the first embodiment.

In the knock sensor signal processing apparatus 31 implemented by a fifth embodiment, the frequency-sampling filters 34 are designed to comprise the first embodiment's 7 kHz filter 34-1, 14 kHz filter 34-2 and 11.2 kHz filter 34-4, which are shown in FIGS. 6, 4 and 10 respectively.

Figure 22:
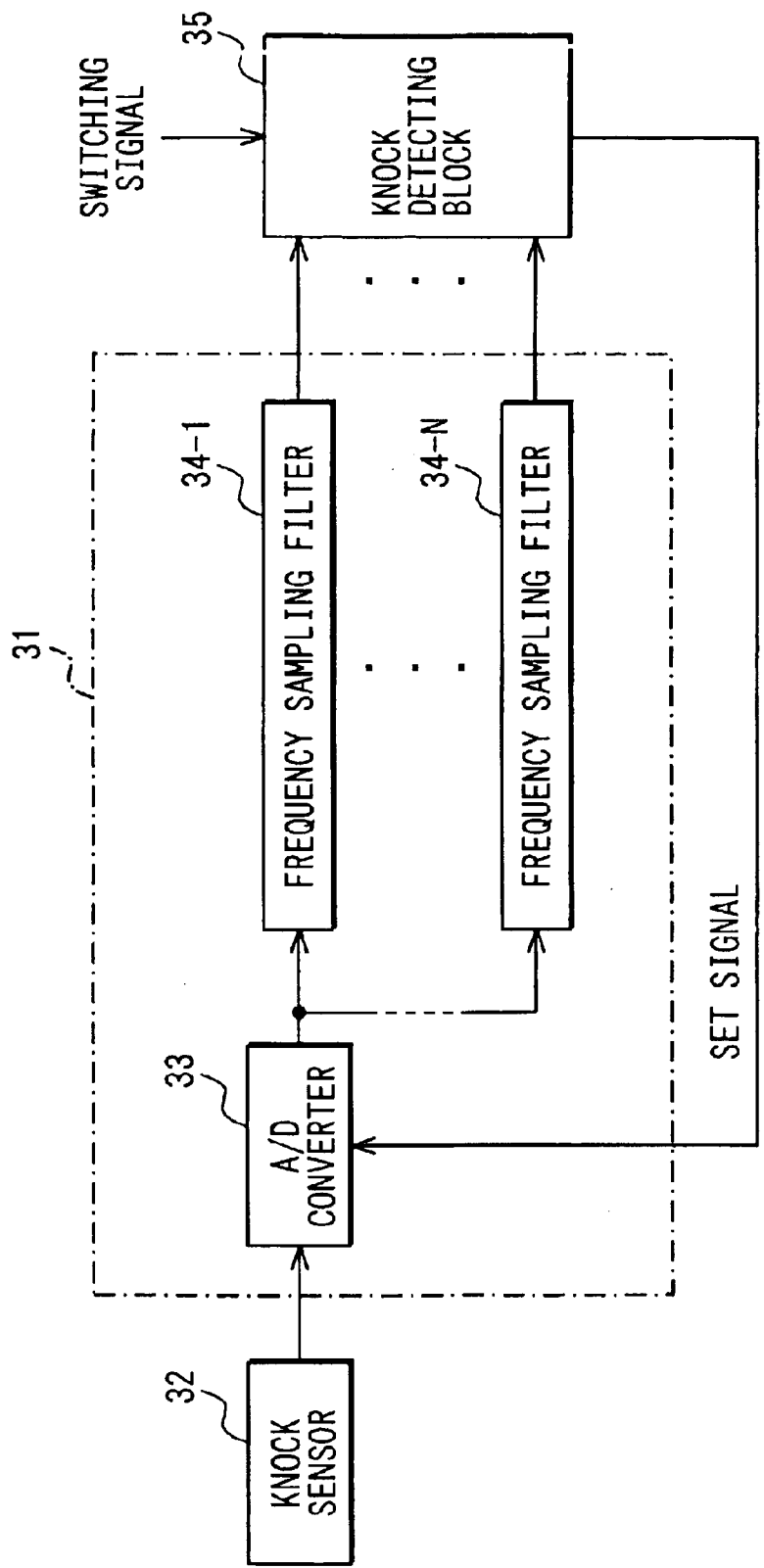
FIG. 22 is a block diagram showing characteristics peculiar to the configuration of a knock sensor signal processing apparatus implemented by a fifth embodiment.

In the knock sensor signal processing apparatus 31 implemented by the fifth embodiment, a switching signal is supplied to the knock detection unit 35 and a setting signal generated by the knock detection unit 35 is supplied to the A/D converter 33 as shown in FIG. 22. The setting signal changes the sampling frequency of the A/D converter 33. In other words, the setting signal changes the sampling period T, that is, the period of the A/D conversion process.

The switching signal is a signal that can have 2 values, namely, a high level and a low level, which are generated as follows. A jumper is provided outside a microcomputer, which plays the roles of the filter 34 and the knock detection unit 35. If the jumper is connected to a power supply's voltage corresponding to the high level of the 2 values, the high level of the switching signal is generated. If the jumper is connected to the ground voltage or a ground line corresponding to the low level of the 2 values, on the other hand, the low level of the switching signal is generated.

If the high level of the switching signal is generated, the knock detection unit 35 sets the sampling frequency of the A/D converter 33 at 112 kHz, which is the same frequency as the first embodiment. If the low level of the switching signal is generated, on the other hand, the knock detection unit 35 sets the sampling frequency of the A/D converter 33 at a frequency different from 112 kHz. In the case of this embodiment, the different frequency is 104 kHz (=112×(6.5/7)).

It is to be noted that a relation between variations of the sampling frequency and the values of the switching signal is stored in a memory such as a ROM, a RAM or a register of the microcomputer, which plays the roles of the filter 34 and the knock detection unit 35. In this embodiment, the sampling frequency varies from 112 kHz to 104 kHz and vice versa while the values of the switching signal are the high and low levels.

As described above, in accordance with the knock sensor signal processing apparatus 31 implemented by the fifth embodiment, in the case of an internal combustion engine of type a, the jumper is connected to generate the high level of the switching signal. An internal combustion engine of type a is an internal combustion engine in which the frequency of the knock fundamental wave, that is, the center frequency of the knock sensor signal generated in the event of a knocking, is 7 kHz as is the case with the first embodiment. In the case of an internal combustion engine of type b, on the other hand, the jumper is connected to generate the low level of the switching signal. An internal combustion engine of type b is an internal combustion engine in which the frequency of the knock fundamental wave is 6.5 kHz.

That is, if the jumper is connected to generate the high level of the switching signal, the sampling frequency of the A/D converter 33 is 112 kHz. Thus, the 7 kHz filter 34-1 shown in FIG. 6 functions as a filter having a filter frequency of 7 kHz, the 11.2 kHz filter 34-4 shown in FIG. 10 functions as a filter having a filter frequency of 11.2 kHz and the 14 kHz filter 34-2 shown in FIG. 4 functions as a filter having a filter frequency of 14 kHz in the same way as the first embodiment. As a result, the 7 kHz filter 34-1, the 11.2 kHz filter 34-4 and the 14 kHz filter 34-2 are filters optimum for detection of knocking generated in the internal combustion engine of type a.

If the jumper is connected to generate the low level of the switching signal, on the other hand, the sampling frequency of the A/D converter 33 is 104 kHz, which is equal to (6.5/7) times 112 kHz. Thus, the 7 kHz filter 34-1 shown in FIG. 6 functions as a filter having a filter frequency of 6.5 kHz instead of 7 kHz, the 11.2 kHz filter 34-4 shown in FIG. 10 functions as a filter having a filter frequency of 10.4 kHz instead of 11.2 kHz and the 14 kHz filter 34-2 shown in FIG. 4 functions as a filter having a filter frequency of 13 kHz instead of 14 kHz. As a result, the filter 34-1, the filter 34-4 and the filter 34-2 are filters optimum for detection of knocking generated in the internal combustion engine of type b.

As described above, in accordance with the knock sensor signal processing apparatus 31 implemented by the fifth embodiment, the 7 kHz filter 34-1, the 11.2 kHz filter 34-4 and the 14 kHz filter 34-2, which are designed to reduce a filter processing load at a certain filter frequency, can be used as they are at a plurality of other filter frequencies to reduce the filter processing loads at the other filter frequencies. Thus, the designs of the filters do not need to be changed in order to keep up with changes in filter frequency.

It is to be noted that the switching signal can be a signal having a plurality of bits instead of a signal having only 2 values. In the case of a switching signal having a plurality of bits, the sampling frequency can be changed in at least 3 different ways. In addition, the switching signal can also be a signal that can be exchanged by serial and/or parallel communications.

In addition, instead of changing the sampling frequency in accordance with a switching signal generated by an external source, values of the sampling frequency can be stored in advance in a ROM of the microcomputer. As another alternative, the value of the sampling frequency can be changed by a program stored in the ROM. In this case, the sampling frequency can be set at an operation initial time in dependence on an initial state in the so-called initialization.

If the frequency of the knock fundamental wave, that is, the filter frequency optimum for the detection of a knocking, changes to a certain degree in dependence on the operating state of the internal combustion engine or another condition, it is possible to provide a configuration in which the sampling frequency of the A/D converter 33 is switched from a value to another in dependence on the operating state of the internal combustion engine or the other condition. For example, it is possible to provide a configuration in which, if the revolution speed of the internal combustion engine is higher than 5,000 rpm, the filter frequencies of the filters 34-1, 34-4 and 34-2 are set at 7 kHz, 11.2 kHz and 14 kHz respectively but, if the revolution speed of the internal combustion engine is equal to or lower than 5,000 rpm, on the other hand, the filter frequencies of the filters 34-1, 34-4 and 34-2 are set at 6.5 kHz, 10.4 kHz and 13 kHz respectively.

In addition, instead of storing values of the sampling frequency in a memory of the microcomputer, it is also possible to store values of the sampling period T in the memory. The same effect can be obtained without regard to whether values of the sampling frequency or values of the sampling period T are stored in the memory.

Furthermore, the technique provided by the fifth embodiment can also be applied to an apparatus including the first embodiment's aforementioned 9.3 kHz filter 34-3 shown in FIG. 8 and/or the other filters provided by the second, third and fourth embodiments to give yet the same effects. This is because the fifth embodiment provides a configuration in which, if the sampling frequency is multiplied by S, the filter frequencies of the filters provided by the first to fourth embodiments are also multiplied by S.

Preferred embodiments of the present invention have been described so far. It is to be noted, however, that a variety of changes can of course be made to the embodiments.

For example, in the embodiments described above, the peak value of wave B is set at ½ times the peak value of wave A except for the fourth embodiment in which the peak value of wave B is set at ¼ times the peak value of wave A. That is, the peak value of wave B is set at (the −Yth power of 2) times the peak value of wave A where Y is an integer of at least 1. It is to be noted, however, that the peak value of wave B is set at X times the peak value of wave A where X is any positive number smaller than 1.

Figure 23:
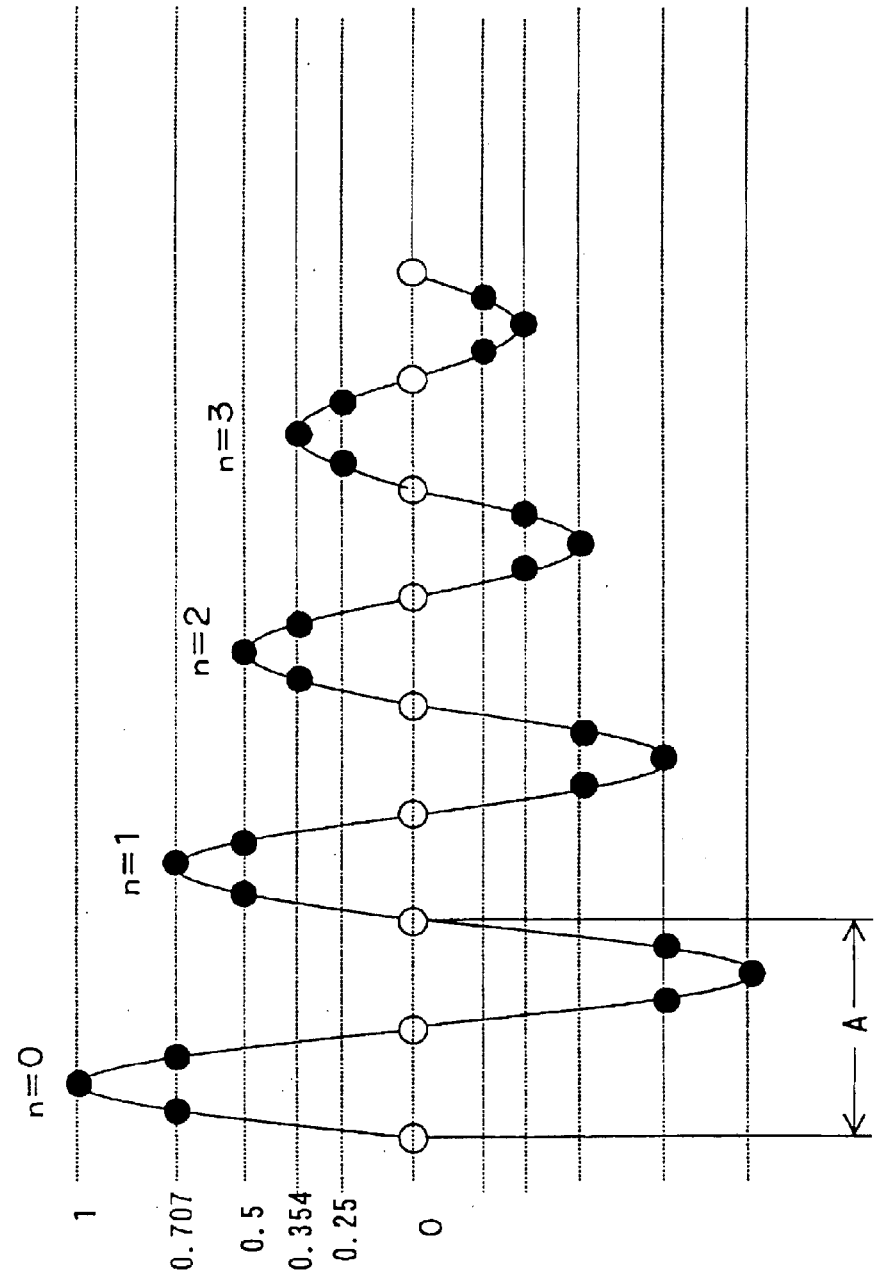
FIG. 23 is part 1 of an explanatory diagram showing another modified version.

If a wave having a peak value equal to (the −n/2th power of 2) times the peak value of wave A where n is an integer of at least 1 is used as wave B, as shown in FIG. 23, the number of mince points each having a value equal to (the −Yth power of 2) times wave A's peak value of 1 is easy to increase. As a result, the filter processing load can be reduced effectively and the knock sensor signal processing apparatus 31 becomes more advantageous. A mince point having a value equal to (the −Yth power of 2) times wave A's peak value of 1 is a mince point having a value equal to (the −Yth power of 2) times the peak value of wave A so that, for the output corresponding to such a mince point, computation processing to multiply a coefficient can be carried out by merely performing a left-shift operation.

In the frequency sampling filters provided by the embodiments, the processing carried out by the multiplication units 49 and 79 to multiply the value of sin 45 degrees can be done with ease by performing the following shift and addition/subtraction operations.

$$\begin{aligned} \text{Sin 45 degrees} &= 0.707\ldots \\ &= 0.003906 + 0.015625 + 0.0625 + 0.125 + 0.5 \\ &= 2^{-8} + 2^{-6} + 2^{-4} + 2^{-3} + 2^{-1} \\ &= ((((2^{-2} + 1) \times 2^{-2} + 1) \times 2^{-1} + 1) \times 2^{-2} + 1) \times 2^{-1} \\ &= 0.707031 \end{aligned}$$

That is, if V is input, the following operation is carried out:

$$((((V{>>}2+V){>>}2+V){>>}1+V){>>}2+V){>>}1$$

where notation V>>n denotes an operation to shift V to the right n times. Thus, an operation to multiply V by the value of sin 45 degrees is carried out by execution of 5 shift instructions and 4 addition/subtraction instructions on V.

By the same token, the processing carried out by the multiplication unit 61 to multiply the value of sin 60 degrees can be done with ease by performing the following shift and addition/subtraction operations.

$$\begin{aligned} \text{Sin 60 degrees} &= 0.866\ldots \\ &= -0.007813 + 0.125 + 0.25 + 0.5 \\ &= -2^{-7} + 2^{-3} + 2^{-2} + 2^{-1} \\ &= (((1 - 2^{-4} \times 2^{-1} + 1) \times 2^{-1} + 1) \times 2^{-1} \\ &= 0.867187 \end{aligned}$$

That is, if W is input, the following operation is carried out:

$$(((W-W{>>}4){>>}1+W){>>}1+W){>>}1$$

where notation W>>n denotes an operation to shift W to the right n times. Thus, an operation to multiply W by the value of sin 60 degrees is carried out by execution of 4 shift instructions and 3 addition/subtraction instructions on W.

Thus, by virtue of a configuration in which the processing carried out by the multiplication units 49 and 79 as well as the processing carried out by the multiplication unit 61 are done by performing shift and addition/subtraction operations as described above, the processing carried out by all the frequency sampling filters 34 described above except the 11.2 kHz filter 34-4 shown in FIG. 10 on sampled data can be done by merely performing shift and addition/subtraction operations.

Figure 24:
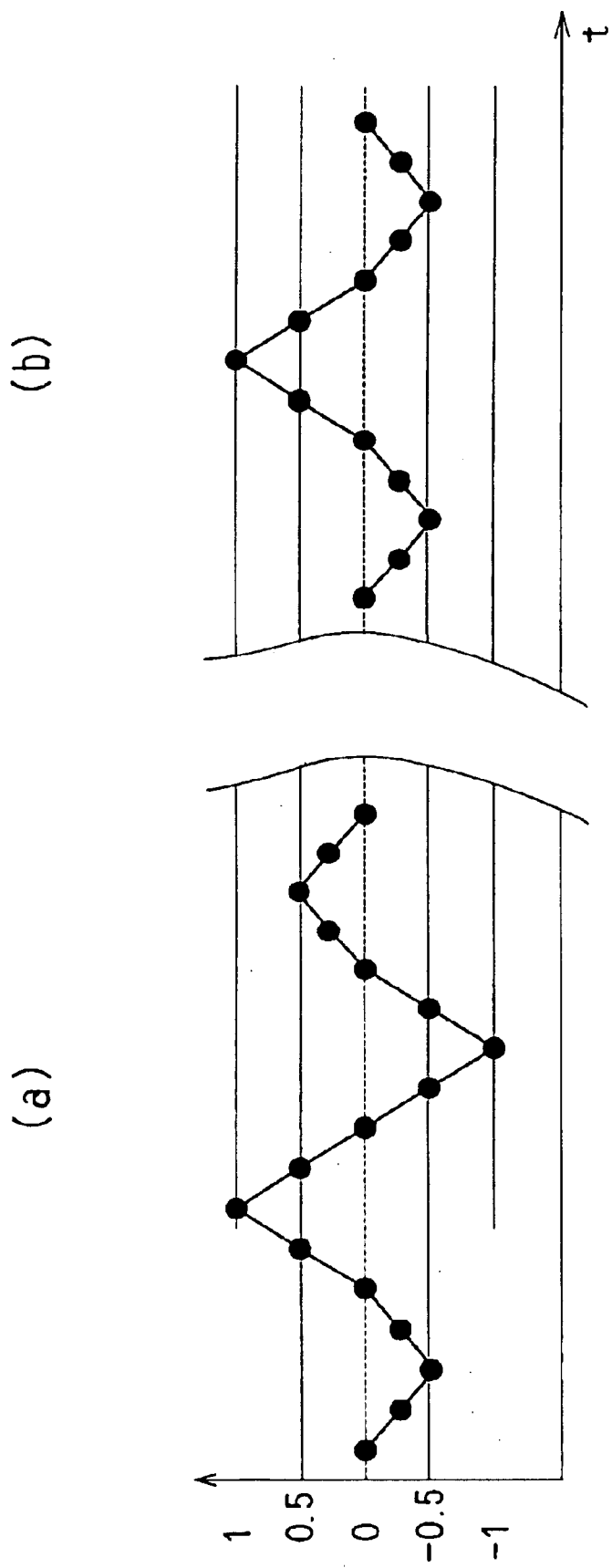
FIG. 24 is part 2 of an explanatory diagram showing a further modified version.

Since the waveform of the sensor-knock signal is generally a sinusoidal waveform, on the other hand, it is desirable to use a sinusoidal waveform in the embodiments as a base waveform used for creating a reference waveform corresponding to the waveform of the wavelet function. As shown in FIG. 24, however, a reference waveform can be created by using triangular waves and a filter reacting to the reference waveform can be designed by adopting the same techniques as those described in the above paragraphs for the embodiments. It is to be noted that FIG. 24A is a diagram showing creation of a reference wave by concatenating waves A and B in the following order: wave B followed by inverted wave A followed by wave A followed by inverted wave B, where wave A denotes a negative half wave of a sinusoidal waveform with a peak value of 1 while wave B denotes a negative half wave of a sinusoidal waveform with a peal value of ½. On the other hand, FIG. 24B is a diagram showing creation of a reference wave by concatenating waves A and B in the following order: wave B followed by inverted wave A followed by inverted wave B, where wave A denotes a negative half wave of a sinusoidal waveform with a peak value of 1 while wave B denotes a negative half wave of a sinusoidal waveform with a peak value of ½.

In addition, the base waveforms each used for creating a reference waveform corresponding to the waveform of the wavelet function are not limited to sinusoidal and triangular waveforms. For example, a saw-tooth waveform can also be used as a base waveform used for creating a reference waveform.

Figure 25:
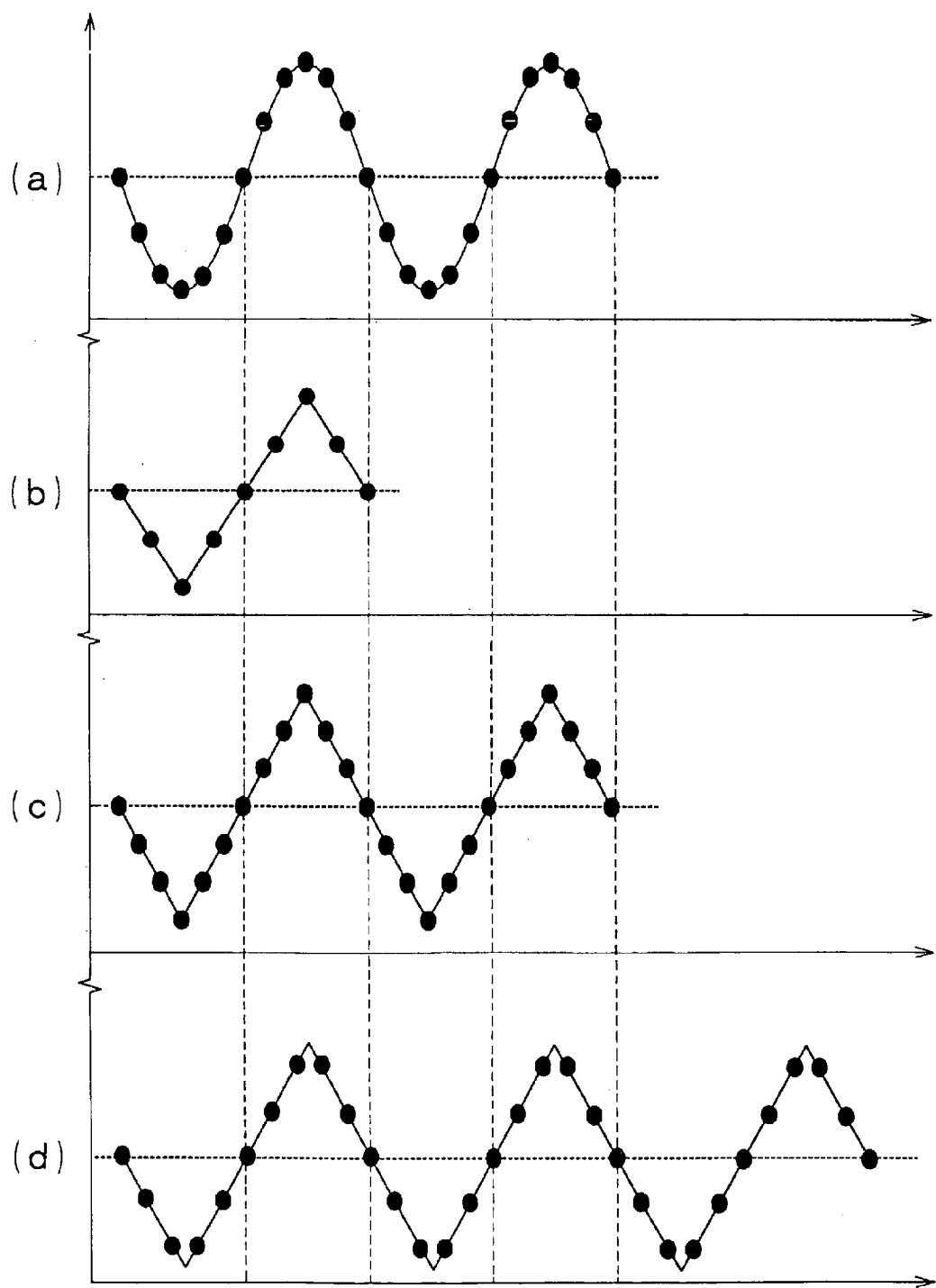
FIG. 25 is part 3 of an explanatory diagram showing a still further modified version.

On the other hand, the reference waveform of a filter can also be any one of constant-peak-value waveforms shown in FIG. 25. It is to be noted that FIG. 25A is a diagram showing a reference waveform consisting of sinusoidal waves stretched over 2 periods, FIG. 25B is a diagram showing a reference waveform consisting of a triangular wave stretched over 1 period, FIG. 25C is a diagram showing a reference waveform consisting of triangular waves stretched over 2 periods and FIG. 25d is a diagram showing a reference waveform consisting of triangular waves stretched over 3 periods.

In addition, in the embodiments, the sampling frequency in each of the embodiments is set at a value most desirable for a combination of filter frequencies of the filters implemented by each of the embodiments. However, the sampling frequency does not have to be set at such a desirable value. For example, the sampling frequency can be set at a value equal to an odd multiple of the filter frequencies, that is, an odd multiple of the least common multiple of the filter frequencies. By setting the sampling frequency at a value equal to an odd multiple of the filter frequencies or an even multiple of the least common multiple of the filter frequencies, however, zero-cross points of the reference wave all become mince points as described above so that the filters become beneficial in that it is possible to increase the number of delay units each generating an output not requiring processing.

Sixth Embodiment

Figure 27:
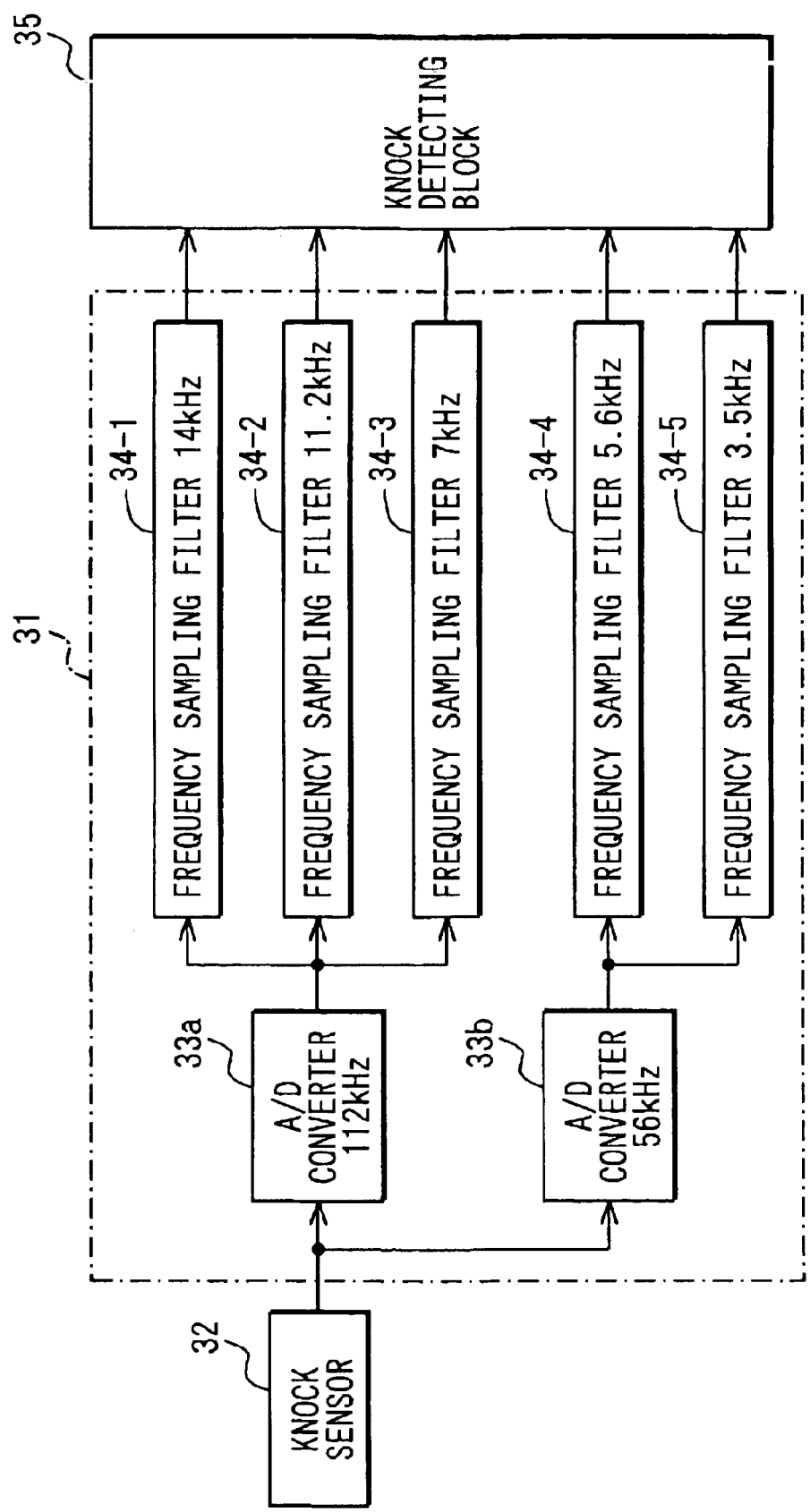
FIG. 27 is a block diagram showing a sixth embodiment.

In the embodiments described above, there is adopted a configuration including only one A/D converter. However, the present invention can be applied also to a configuration employing a plurality of A/D converters. As shown in FIG. 27, for example, the present invention is applied to a configuration employing 2 A/D converters.

In a sixth embodiment of the present invention, the nock-sensor signal is supplied to 2 A/D converters 33a and 33b. In the A/D converter 33a, the sampling frequency f1 is set at 11.2 kHz. Filter processing is carried out for filter frequencies of 14 kHz (=f1/8), 11.2 kHz (=f1/10) and 7 kHz (=f1/16), which are related to knocks. In the A/D converter 33b, on the other hand, the sampling frequency f2 is set at 56 kHz. Filter processing is carried out for filter frequencies of 5.6 kHz (=f2/10) and 3.5 kHz (=f2/16), which are related to noises. Since the sampling frequencies f1 and f2 can be changed independently of each other in this case, the sampling frequencies f1 and f2 can each be set at a value suitable for the internal combustion engine with ease. That is, if the shape of the internal combustion engine is changed to result in a variation in knock frequency, for example, only the sampling frequency f1 on the knock side is modified, leaving the sampling frequency f2 on the noise side unchanged in order to keep up with the variation in knock frequency.

As an alternative, the sampling frequency f1 can be set at a value for filter frequencies of 14 kHz, 7 kHz and 3.5 kHz whereas the sampling frequency f2 can be set at a value for filter frequencies of 11.2 kHz and 3.5 kHz.

Although the present invention has been described in connection with the preferred embodiments thereof with reference to the accompanying drawings, it is to be noted that various changes and modifications will be apparent to those skilled in the art. Such changes and modifications are to be understood as being included within the scope of the present invention as defined in the appended claims.

What is claimed is:

1. A knock sensor signal processing apparatus comprising:
   an A/D converter for carrying out an A/D conversion process on an analog signal generated by a knock sensor installed in an internal combustion engine at a fixed sampling period; and
   a digital filter for sequentially inputting pieces of data obtained as a result of the A/D conversion process carried out by the A/D converter and processing the data,
   wherein:
      the digital filter is a FIR filter; and
      if the sign of a filter h(m−1) of the digital filter is different from the sign of a filter h(m+1) where notation m denotes a positive integer in the range 0 to (n−1), the sign of a filter h(m) is 0.

2. A knock sensor signal processing apparatus comprising:
   an A/D converter for carrying out an A/D conversion process on an analog signal generated by a knock sensor installed in an internal combustion engine at a fixed sampling period; and
   a digital filter for sequentially inputting pieces of data obtained as a result of the A/D conversion process carried out by the A/D converter and processing the data,
   wherein:
      the digital filter is a FIR filter; and
      at least 4 filter coefficients of the digital filter have the same absolute value.

3. A knock sensor signal processing apparatus comprising:
   an A/D converter for carrying out an A/D conversion process on an analog signal generated by a knock sensor installed in an internal combustion engine at a fixed sampling period; and
   a digital filter for sequentially inputting pieces of data obtained as a result of the A/D conversion process carried out by the A/D converter and processing the data,
   wherein the digital filter carries out computation processing on the data by performing only shift and addition/subtraction operations;
   the digital filter is a FIR filter; and
   coefficients serving as basics of the FIR filter are selected on the basis of a waveform created by concatenation of triangular waves.

4. A knock sensor signal processing apparatus comprising:
   an A/D converter for carrying out an A/D conversion process on an analog signal generated by a knock sensor installed in an internal combustion engine at a fixed sampling period; and
   a digital filter for sequentially inputting pieces of data obtained as a result of the A/D conversion process carried out by the A/D converter and processing the data,
   wherein a filter frequency of the digital filter is changed each time the sampling period is changed.

5. A design method of a knock sensor signal processing apparatus comprising:
   an A/D converter for carrying out an A/D conversion process on an analog signal generated by a knock sensor installed in an internal combustion engine at a fixed sampling period; and
   a plurality of digital filters each used for sequentially inputting pieces of data obtained as a result of the A/D conversion process carried out by the A/D converter and processing the data and each provided for one of the same plurality of filter frequencies, wherein:
      each of the digital filters is a FIR filter; and
      a sampling frequency, which is the reciprocal of the sampling period, is set at a common multiple of the filter frequencies, or the sampling period is set at a common divisor of periods of time, which are each the reciprocal of one of the filter frequencies.

6. The design method of knock sensor signal processing apparatus according to claim 5 whereby the sampling frequency is set at an even multiple of a least common multiple of the filter frequencies, or the sampling period is set at an even fraction a greatest common measure of periods of time, which are each the reciprocal of one of the filter frequencies.

7. The design method of knock sensor signal processing apparatus according to claim 5 whereby, if a specific one of the filter frequencies is equal to 1/n of a particular one of the filter frequencies where n is a positive integer, one of the digital filters that has a filter frequency equal to the specific filter frequency, which is equal to 1/n of the particular filter frequency, is designed as an FIR filter by replacing each delay unit employed in one of the digital filters that has a filter frequency equal to the particular filter frequency with n delay units connected to each other in series.

8. A design method of a knock sensor signal processing apparatus comprising:
   an A/D converter for carrying out an A/D conversion process on an analog signal generated by a knock sensor installed in an internal combustion engine at a fixed sampling period; and
   a sampling frequency filter functioning as a digital filter used for sequentially inputting pieces of time-axis data obtained as a result of the A/D conversion process carried out by the A/D converter and processing the data wherein, when the frequency of an input waveform, which is a waveform of the time-axis data supplied by the A/D converter, is equal to an object frequency of the sampling frequency filter, and the input waveform substantially exceeds a reference waveform having a frequency equal to the object frequency in the upward and downward directions, an output value of the sampling frequency filter increases in such a manner that, the more substantially the input waveform exceeds the reference waveform, the more the output value of the sampling frequency filter increases, whereby:
  the reference waveform is created as a waveform having a left-right inverted symmetrical shape including 1 wave A and 2 waves B by concatenating the waves A and B where the wave A is a half wave of a base waveform with a frequency equal to the object frequency and a certain peak value while the wave B is a negative-side inverted wave with a peak value equal to X times the certain peak value of the wave A where X is a multiplier equal to a positive integer smaller than 1;
  a sampling frequency, which is the reciprocal of the sampling period, is set at m times the object frequency where m is an integer at least equal to 3; and
  an FIR filter is used as the sampling frequency filter and coefficients of the FIR filter are set at values equal to values of respective mince points, which are obtained on the reference waveform having a left-right inverted symmetrical shape by mincing the reference waveform starting from an end of the reference waveform at intervals each equal to the sampling period.

9. A design method of a knock sensor signal processing apparatus comprising:
  an A/D converter for carrying out an A/D conversion process on an analog signal generated by a knock sensor installed in an internal combustion engine at a fixed sampling period; and
  a sampling frequency filter functioning as a digital filter used for sequentially inputting pieces of time-axis data obtained as a result of the A/D conversion process carried out by the A/D converter and processing the data wherein, when the frequency of an input waveform, which is a waveform of the time-axis data supplied by the A/D converter, is equal to an object frequency of the sampling frequency filter, and the input waveform substantially exceeds a reference waveform having a frequency equal to the object frequency in the upward and downward directions, an output value of the sampling frequency filter increases in such a manner that, the more substantially the input waveform exceeds the reference waveform, the more the output value of the sampling frequency filter increases, whereby:
  the reference waveform is created as a waveform having a left-right inverted symmetrical shape including two waves A and two waves B by concatenating the waves A and B where the wave A is a half wave of a base waveform with a frequency equal to the object frequency and a certain peak value while the wave B is a wave with a peak value equal to X times the certain peak value of the wave A where X is a positive integer smaller than 1;
  a sampling frequency, which is the reciprocal of the sampling period, is set at m times the object frequency where m is an integer at least equal to 3; and
  an FIR filter is used as the sampling frequency filter and coefficients of the FIR filter are set at values equal to values of respective mince points, which are obtained on the reference waveform having a left-right inverted symmetrical shape by mincing the reference waveform starting from an end of the reference waveform at intervals each equal to the sampling period.

10. A design method of a knock sensor signal processing apparatus comprising:
  an A/D converter for carrying out an A/D conversion process on an analog signal generated by a knock sensor installed in an internal combustion engine at a fixed sampling period; and
  a sampling frequency filter functioning as a digital filter used for sequentially inputting pieces of time-axis data obtained as a result of the A/D conversion process carried out by the A/D converter and processing the data wherein, when the frequency of an input waveform, which is a waveform of the time-axis data supplied by the A/D converter, is equal to an object frequency of the sampling frequency filter, and the input waveform substantially exceeds a reference waveform having a frequency equal to the object frequency in the upward and downward directions, an output value of the sampling frequency filter increases in such a manner that, the more substantially the input waveform exceeds the reference waveform, the more the output value of the sampling frequency filter increases, whereby:
  the reference waveform is created as a waveform by concatenating waves A and waves B where the wave A is a full wave of a base waveform with a frequency equal to the object frequency and a certain peak value while the wave B is a wave with a peak value equal to X times the certain peak value of the wave A where X is a positive integer smaller than 1;
  a sampling frequency, which is the reciprocal of the sampling period, is set at m times the object frequency where m is an integer at least equal to 3; and
  an FIR filter is used as the sampling frequency filter, coefficients of the FIR filter are set at values equal to values of respective mince points, which are obtained on the reference waveform by mincing the reference waveform starting from an end of the reference waveform at intervals each equal to the sampling period and the coefficients for pieces of input data are associated with the mince points in such a way that the more recent the piece of input data, the closer the mince point to the reference waveform's start end on a wave-B side.

11. The design method of knock sensor signal processing apparatus according to claim 8 wherein the multiplier X is the (−n/2)th power of 2 where n is an integer at least equal to 1.

* * * * *